United States Patent
Yamaguchi et al.

(10) Patent No.: US 11,702,504 B2
(45) Date of Patent: Jul. 18, 2023

(54) RESIN COMPOSITION FOR PRINTED WIRING BOARD, PREPREG, LAMINATE, METAL FOIL-CLAD LAMINATE, PRINTED WIRING BOARD, AND MULTILAYER PRINTED WIRING BOARD

(71) Applicant: MITSUBISHI GAS CHEMICAL COMPANY, INC., Tokyo (JP)

(72) Inventors: Shohei Yamaguchi, Tokyo (JP); Katsuya Tomizawa, Tokyo (JP); Norihiro Shida, Tokyo (JP); Hidetoshi Kawai, Tokyo (JP)

(73) Assignee: MITSUBISHI GAS CHEMICAL COMPANY, INC., Tokyo (JP)

(*) Notice: Subject to any disclaimer, the term of this patent is extended or adjusted under 35 U.S.C. 154(b) by 354 days.

(21) Appl. No.: 17/264,528

(22) PCT Filed: Jun. 28, 2019

(86) PCT No.: PCT/JP2019/025921
§ 371 (c)(1),
(2) Date: Jan. 29, 2021

(87) PCT Pub. No.: WO2020/031545
PCT Pub. Date: Feb. 13, 2020

(65) Prior Publication Data
US 2021/0301071 A1    Sep. 30, 2021

(30) Foreign Application Priority Data
Aug. 9, 2018 (JP) .................. 2018-150563

(51) Int. Cl.
*C08G 59/50* (2006.01)
*B32B 15/14* (2006.01)
(Continued)

(52) U.S. Cl.
CPC .......... *C08G 59/5073* (2013.01); *B32B 5/024* (2013.01); *B32B 5/263* (2021.05);
(Continued)

(58) Field of Classification Search
None
See application file for complete search history.

(56) References Cited

U.S. PATENT DOCUMENTS

2009/0200071 A1   8/2009   Morita et al.
2013/0089743 A1   4/2013   Ogashiwa et al.
(Continued)

FOREIGN PATENT DOCUMENTS

CN    103342876 A    10/2013
CN    103443200 A    12/2013
(Continued)

OTHER PUBLICATIONS

Machine translation of detailed description of JP 2017-031402. Acquired Mar. 21, 2023.*
(Continued)

*Primary Examiner* — Gerard Higgins
(74) *Attorney, Agent, or Firm* — Greenblum & Bernstein, P.L.C.

(57) ABSTRACT

A resin composition for a printed wiring board, including: a phenolic compound (A); a maleimide compound (B); an epoxy compound (C); a cyclic carbodiimide compound (D); an inorganic filler (E); and a curing accelerator (F), wherein a content of the inorganic filler (E) is 100 to 250 parts by mass based on 100 parts by mass of a resin solid content.

16 Claims, 1 Drawing Sheet

(51) Int. Cl.
   *H05K 1/03* (2006.01)
   *B32B 5/02* (2006.01)
   *C08G 59/24* (2006.01)
   *C08G 59/68* (2006.01)
   *C08J 5/24* (2006.01)
   *B32B 5/26* (2006.01)
   *B32B 15/20* (2006.01)
   *C08G 59/40* (2006.01)
   *C08G 59/62* (2006.01)

(52) U.S. Cl.
   CPC .............. *B32B 15/14* (2013.01); *B32B 15/20* (2013.01); *C08G 59/245* (2013.01); *C08G 59/4042* (2013.01); *C08G 59/621* (2013.01); *C08G 59/686* (2013.01); *C08J 5/244* (2021.05); *C08J 5/249* (2021.05); *H05K 1/0373* (2013.01); *B32B 2260/021* (2013.01); *B32B 2260/046* (2013.01); *B32B 2262/101* (2013.01); *B32B 2264/1021* (2020.08); *B32B 2457/08* (2013.01); *C08J 2363/00* (2013.01); *C08J 2461/04* (2013.01); *C08J 2479/08* (2013.01); *H05K 2201/0209* (2013.01)

(56) References Cited

U.S. PATENT DOCUMENTS

| | | |
|---|---|---|
| 2014/0017502 A1 | 1/2014 | Kato et al. |
| 2017/0037238 A1 | 2/2017 | Kushihara et al. |
| 2017/0253693 A1 | 9/2017 | Shoji et al. |
| 2018/0066101 A1 | 3/2018 | Kushihara et al. |
| 2020/0317913 A1* | 10/2020 | Shoji ........................ C08J 5/243 |

FOREIGN PATENT DOCUMENTS

| | | | |
|---|---|---|---|
| CN | 106715578 A | 5/2017 | |
| CN | 107298925 A | 10/2017 | |
| JP | 2014-185221 A | 10/2014 | |
| JP | 2017-031402 A | 2/2017 | |
| JP | 2017-125150 A | 7/2017 | |
| JP | 2018-035308 A | 3/2018 | |
| JP | 2018-053092 A | 4/2018 | |
| WO | 2016/039486 A1 | 3/2016 | |
| WO | 2017/168732 A1 | 10/2017 | |
| WO | WO-2019124558 A1 * | 6/2019 | ........... C08G 18/095 |

OTHER PUBLICATIONS

International Search Report issued in International Patent Application No. PCT/JP2019/025921, dated Aug. 27, 2019, along with English Translation thereof.

Written Opinion of the International Searching Authority issued in International Patent Application No. PCT/JP2019/025921, dated Aug. 27, 2019, along with English Translation thereof.

* cited by examiner

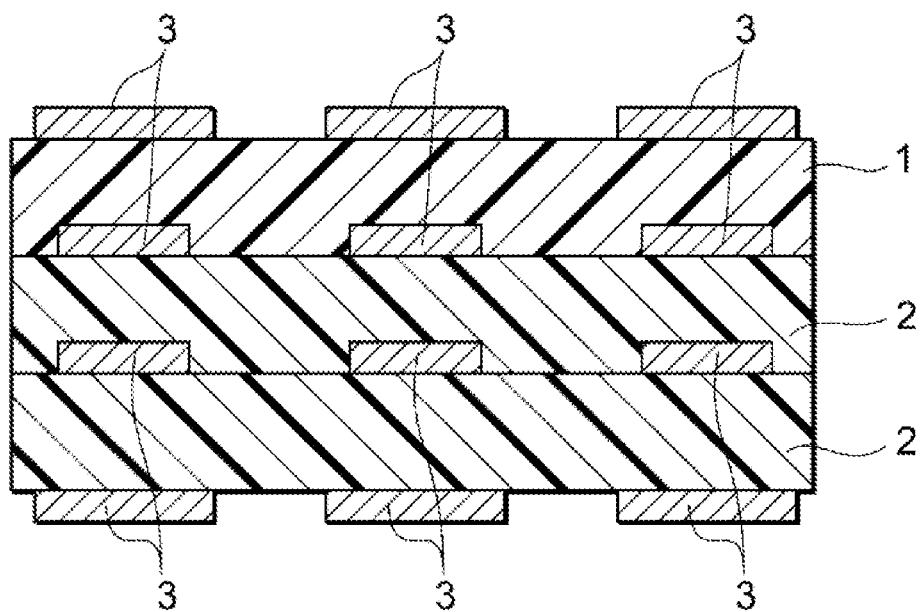

RESIN COMPOSITION FOR PRINTED WIRING BOARD, PREPREG, LAMINATE, METAL FOIL-CLAD LAMINATE, PRINTED WIRING BOARD, AND MULTILAYER PRINTED WIRING BOARD

TECHNICAL FIELD

The present invention relates to a resin composition for a printed wiring board, a prepreg, a laminate, a metal foil-clad laminate, a printed wiring board, and a multilayer printed wiring board.

BACKGROUND ART

In recent years, as semiconductor packages, which are widely used in electronic equipment, communication instruments, and personal computers, have become more functional and smaller in size, the trend toward higher integration and higher density mounting of each component for semiconductor packages has been accelerating more and more in recent years.

For example, Patent Literature 1 discloses a resin composition for use in electronic components, comprising a thermosetting resin and a cyclic carbodiimide compound. According to this literature, it is disclosed that the resin composition comprising a cyclic carbodiimide compound makes the glass transition temperature (Tg) higher without lowering the flow properties such as gel time and melt viscosity.

CITATION LIST

Patent Literature

Patent Literature 1: Japanese Patent Laid-Open No. 2017-125150

SUMMARY OF INVENTION

Technical Problem

In recent years, upon producing electronic components (packages) using printed wiring boards (especially, multilayer coreless boards), it has become an important challenge to improve high heat resistance, chemical resistance, low water absorption, dielectric properties (low dielectric constant and low dielectric loss tangent), and flame retardance. Patent Literature 1 envisages that the resin composition is to be used for a sealing material, a substrate material such as a core layer, a buildup layer, and a solder resist layer, and a photodetector such as a white diode. However, Patent Literature 1 does not discuss improving chemical resistance, electrical properties, and flame retardance.

Also, the inclusion of a multifunctional thermosetting resin as a material (composition) to be used for printed wiring boards is effective because it can improve the heat resistance. However, further improvement in chemical resistance and electrical properties (low dielectric constant and low dielectric loss tangent) has been required for the material (composition) containing the above multifunctional thermosetting resin.

The present invention has been made in view of the problems described above, and it is intended to provide a resin composition for a printed wiring board, a prepreg, a laminate, a metal foil-clad laminate, a printed wiring board, and a multilayer printed wiring board that simultaneously satisfy in a well balanced manner excellent flow properties, heat resistance, chemical resistance, and electrical properties.

Solution to Problem

As a result of diligent investigations to solve the problems described above, the present inventors have found that the above problems can be solved by combining a phenolic compound (A), a maleimide compound (B), an epoxy compound (C), a cyclic carbodiimide compound (D), an inorganic filler (E), and a curing accelerator (F) and setting the content of the inorganic filler (E) within a particular range, and thus have reached the completion of the present invention.

More specifically, the present invention is as follows.

[1]

A resin composition for a printed wiring board, comprising:

a phenolic compound (A); a maleimide compound (B); an epoxy compound (C); a cyclic carbodiimide compound (D); an inorganic filler (E); and a curing accelerator (F), wherein a content of the inorganic filler (E) is 100 to 250 parts by mass based on 100 parts by mass of a resin solid content.

[2]

The resin composition for the printed wiring board according to [1], wherein a content of the cyclic carbodiimide compound (D) is 2.0 to 15 parts by mass based on 100 parts by mass of the resin solid content.

[3]

The resin composition for the printed wiring board according to [1] or [2], wherein a content of the cyclic carbodiimide compound (D) is 2.5 to 12.0 parts by mass based on 100 parts by mass of the resin solid content.

[4]

The resin composition for the printed wiring board according to any one of [1] to [3], wherein a content of the maleimide compound (B) is 10 to 30 parts by mass based on 100 parts by mass of the resin solid content.

[5]

The resin composition for the printed wiring board according to any one of [1] to [4], wherein the cyclic carbodiimide compound (D) has a cyclic structure represented by the following formula (1) and the number of atoms forming the cyclic structure is 8 to 50.

(1)

(In the formula (1), L is a divalent to tetravalent bonding group, which is an aliphatic group, an alicyclic group, an aromatic group, or a group formed by combining them, and the bonding group optionally contains a heteroatom and/or a substituent.)

[6]

The resin composition for the printed wiring board according to any one of [1] to [5], wherein the cyclic carbodiimide compound (D) comprises a polyvalent cyclic carbodiimide compound containing 2 or more carbodiimide groups in one molecule.

[7]

The resin composition for the printed wiring board according to [6], wherein the polyvalent cyclic carbodiimide compound is a compound represented by the following formula (2).

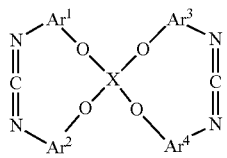

(2)

(In the formula (2), X is a tetravalent group represented by the following formula (3), $Ar^1$ to $Ar^4$ are each independently a divalent linking group, which is a phenylene group or a naphthalene-diyl group, and the linking group optionally has a substituent.)

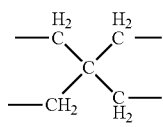

(3)

[8]

The resin composition for the printed wiring board according to [7], wherein the compound represented by the above formula (2) is a compound represented by the following formula (4).

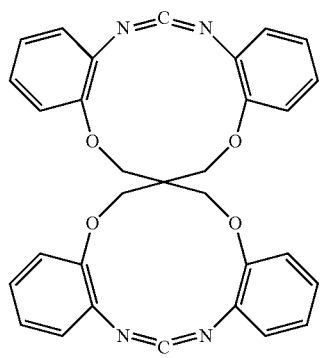

(4)

[9]

The resin composition for the printed wiring board according to any one of [1] to [8], wherein the curing accelerator (F) comprises an imidazole compound and/or an organic phosphorus compound.

[10]

The resin composition for the printed wiring board according to any one of [1] to [9], wherein the curing accelerator (F) comprises a compound represented by the following formula (5).

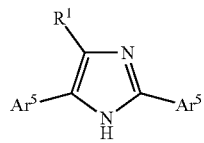

(5)

(In the formula (5), each $Ar^5$ independently represents a phenyl group, a naphthalene group, a biphenyl group, or an anthracene group, all of which optionally have a substituent, $R^1$ represents a hydrogen atom, an alkyl group, or an aryl group, and when $R^1$ represents an alkyl group or an aryl group, it optionally has a substituent.)

[11]

The resin composition for the printed wiring board according to any of [1] to [10], wherein the inorganic filler (E) comprises one or more selected from the group consisting of silica, boehmite, and alumina.

[12]

A prepreg comprising: a base material; and the resin composition for the printed wiring board according to any of [1] to [11] with which the base material is impregnated or coated.

[13]

A laminate comprising: the prepreg according to [12].

[14]

A metal foil-clad laminate comprising:

the prepreg according to [12]; and metal foil disposed on one surface or both surfaces of the prepreg.

[15]

A printed wiring board comprising: an insulating layer formed of the prepreg according to [12]; and a conductor layer formed on a surface of the insulating layer.

[16]

A multilayer printed wiring board comprising:

a plurality of insulating layers comprising a first insulating layer and one or a plurality of second insulating layers laminated on one surface side of the first insulating layer; and a plurality of conductor layers comprising a first conductor layer disposed between each of the plurality of insulating layers and a second conductor layer disposed on a surface of an outermost layer of the plurality of insulating layers, wherein the first insulating layer and the second insulating layer each have the prepreg according to [12].

Advantageous Effects of Invention

According to the present invention, a resin composition for a printed wiring board, a prepreg, a laminate, a metal foil-clad laminate, a printed wiring board, and a multilayer printed wiring board that simultaneously satisfy in a well balanced manner excellent flow properties, heat resistance, chemical resistance, and electrical properties can be provided.

BRIEF DESCRIPTION OF DRAWINGS

FIG. 1 shows a partial cross sectional view showing the configuration of one example of a panel of a multilayer coreless substrate.

DESCRIPTION OF EMBODIMENTS

A mode for carrying out the present invention (hereinafter, referred to as a "present embodiment") will be described in detail below, but the present invention is not limited to this, and various modifications can be made without departing from the spirit thereof.

The "resin solid content" in the present specification refers to components in a resin composition for a printed wiring board of the present embodiment, excluding a solvent and a filler, unless otherwise noted, and 100 parts by mass of the resin solid content refers to the total of components in the resin composition for a printed wiring board excluding a solvent and a filler being 100 parts by mass.

[Resin Composition for a Printed Wiring Board]

A resin composition for a printed wiring board (also simply referred to as a "resin composition") of the present embodiment comprises: a phenolic compound (A); a maleimide compound (B); an epoxy compound (C); a cyclic carbodiimide compound (D); an inorganic filler (E); and a curing accelerator (F). The content of the inorganic filler (E) is 100 to 250 parts by mass based on 100 parts by mass of the resin solid content. By possessing the configuration described above, the resin composition of the present embodiment can simultaneously satisfy, for example, excellent flow properties, heat resistance, chemical resistance, low water absorption, and electrical properties in a well balanced manner. Therefore, the resin composition of the present embodiment is used as a material for printed wiring boards, and a printed wiring board obtained from the resin composition of the present embodiment is excellent in the heat resistance, chemical resistance, low water absorption, and electrical properties. Factors that could improve each of these properties without worsening the flow properties are considered to include, but are not limited to, the following. Since the cyclic carbodiimide compound (D) has a high melting point, for example, it has a low reactivity with each resin at a temperature at the time of making a prepreg (about 140° C.), thereby not worsening the flow properties of the resin composition. Then, during press forming at a higher temperature, the cyclic carbodiimide compound (D) is melted and reacts with a thermosetting resin (for example, a phenolic resin or an epoxy resin) to form a structure with a high crosslinking density, thus improving the glass transition temperature and chemical resistance. In addition, since the cyclic carbodiimide compound (D) can reduce hydroxy groups, which worsen the dielectric loss tangent, by reacting with phenolic or alcoholic hydroxy groups to form a crosslinked structure, the dielectric loss tangent of the cured product is lowered.

(Phenolic Compound (A))

The resin composition of the present embodiment contains a phenolic compound (A). The term "compound" in the present specification refers to a concept that encompasses a resin. Examples of the phenolic compound (A) include phenolic compounds having two or more phenolic hydroxy groups in one molecule. Examples of such phenolic compounds include, but are not particularly limited to, for example, bisphenols (for example, bisphenol A, bisphenol E, bisphenol F, bisphenol S, and the like), diallyl bisphenols (for example, diallyl bisphenol A, diallyl bisphenol E, diallyl bisphenol F, diallyl bisphenol S, and the like), bisphenol-based phenolic resins (for example, bisphenol A-based resins, bisphenol E-based resins, bisphenol F-based resins, bisphenol S-based resins, and the like), phenol novolac resins (for example, phenol novolac resins, naphthol novolac resins, cresol novolac resins, and the like), glycidyl ester-based phenolic resins, naphthalene-based phenolic resins, anthracene-based phenolic resins, dicyclopentadiene-based phenolic resins, biphenyl-based phenolic resins, alicyclic phenolic resins, polyol-based phenolic resins, aralkyl-based phenolic resins, phenol-modified aromatic hydrocarbon formaldehyde resins, and the like. These phenolic compounds are used alone, or used in combination of two or more kinds.

Among the above, it is preferable that the phenolic compound (A) should be an aralkyl-based phenolic resin from the viewpoint that it is further excellent in the coefficient of linear thermal expansion (CTE), glass transition temperature (Tg), heat resistance, and low water absorption.

(Aralkyl-Based Phenolic Resin)

Examples of the aralkyl-based phenolic resin include, but are not particularly limited to, for example, a compound represented by the following formula (A1).

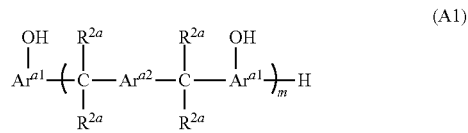

(A1)

(In the formula (A1), each $Ar^{a1}$ independently represents a benzene ring or a naphthalene ring, $Ar^{a2}$ represents a benzene ring, a naphthalene ring, or a biphenyl ring, each $R^{2a}$ independently represents a hydrogen atom or a methyl group, m represents an integer of 1 to 50, and each ring optionally has a substituent other than a hydroxy group (for example, an alkyl group having 1 to 5 carbon atoms, a phenyl group, or the like.)

It is preferable that the compound represented by the formula (A1) should be a compound wherein, in the formula (A1), $Ar^{a1}$ is a naphthalene ring and $Ar^{a2}$ is a benzene ring (also referred to as a "naphthol aralkyl-based phenolic resin") or a compound wherein, in the formula (A1), $Ar^{a1}$ is a benzene ring and $Ar^{a2}$ is a biphenyl ring (also referred to as a "biphenyl aralkyl-based phenolic resin") from the viewpoint that it is further excellent in the coefficient of linear thermal expansion (CTE), glass transition temperature (Tg), copper foil peel strength, heat resistance, and low water absorption.

It is preferable that the naphthol aralkyl-based phenolic resin should be a compound represented by the following formula (A2).

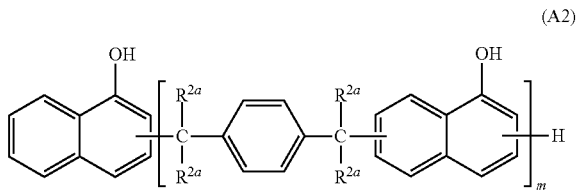

(A2)

(In the formula (A2), each $R^{2a}$ independently represents a hydrogen atom or a methyl group (preferably a hydrogen atom), and m represents an integer of 1 to 10 (preferably an integer of 1 to 6).)

It is preferable that the biphenyl aralkyl-based phenolic resin should be a compound represented by the following formula (A3).

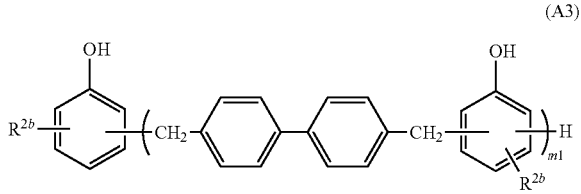

(A3)

(In the formula (A3), each $R^{2b}$ independently represents a hydrogen atom, an alkyl group having 1 to 5 carbon atoms, or a phenyl group (preferably a hydrogen atom), and m1 represents an integer of 1 to 20 (preferably an integer of 1 to 6).)

As the aralkyl-based phenolic resin, commercial products may be used, or products synthesized by publicly known methods may be used. Examples of the commercial products of the aralkyl-based phenolic resin include products from Nippon Kayaku Co., Ltd., "KAYAHARD GPH-65", "KAYAHARD GPH-78", and "KAYAHARD GPH-103" (all of which are biphenyl aralkyl-based phenolic resins represented by the formula (A3), and a product from the new Nippon Steel Chemical Co., Ltd., "SN-495-V" (a naphthol aralkyl-based phenolic resin represented by the formula (A2)).

The content of the phenolic compound (A) is not particularly limited and is preferably 15 to 45 parts by mass based on 100 parts by mass of the resin solid content, more preferably 20 to 40 parts by mass, and still more preferably 25 to 35 parts by mass, from the viewpoint of being further excellent in the glass transition temperature (Tg), heat resistance, and low water absorption.

(Maleimide Compound (B))

The resin composition of the present embodiment contains a maleimide compound (B). Examples of the maleimide compound (B) include maleimide compounds having one or more maleimide groups in one molecule. Examples of such maleimide compounds include, but are not particularly limited to, for example, monomaleimide compounds, which have one maleimide group in one molecule (for example, N-phenylmaleimide, N-hydroxyphenylmaleimide, and the like), polymaleimide compounds, which have two or more maleimide groups in one molecule (for example, bis(4-maleimidophenyl)methane, bis(3,5-dimethyl-4-maleimidophenyl)methane, bis(3-ethyl-5-methyl-4-maleimidophenyl)methane, bis(3,5-diethyl-4-maleimidophenyl)methane), prepolymers between these maleimide compounds and amine compounds, and the like. These maleimide compounds are used alone, or used in combination of two or more kinds. Among the above, it is preferable that the maleimide compound (B) should be a polymaleimide compound from the viewpoint that it is further excellent in the coefficient of linear thermal expansion (CTE), glass transition temperature (Tg), and heat resistance.

Examples of the polymaleimide compound include, but are not particularly limited to, for example, compounds in which a plurality of maleimide groups are bonded to a benzene ring (for example, phenylene bismaleimides such as m-phenylene bismaleimide, 4-methyl-1,3-phenylene bismaleimide, and the like), compounds in which maleimide groups are bonded to both terminals of a linear or branched alkyl chain (for example, 1,6-bismaleimide-(2,2,4-trimethyl)hexane, and the like), bisphenol A diphenyl ether bismaleimide, compounds represented by the following formula (B1).

Among the above, it is preferable that the maleimide compound (B) should be a compound represented by the following formula (B1) from the viewpoint that it is further excellent in the coefficient of linear thermal expansion (CTE), glass transition temperature (Tg), and heat resistance.

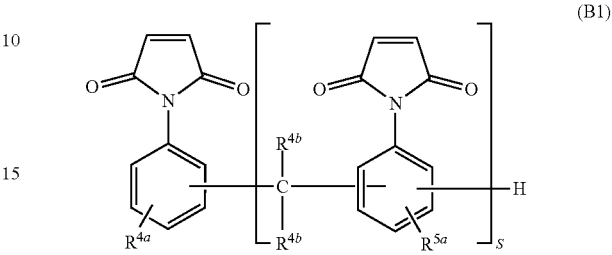

(B1)

(In the formula (B1), $R^{4a}$ and $R^{5a}$ each independently represent a hydrogen atom or an alkyl group having 1 to 5 carbon atoms, and preferably represent a hydrogen atom. Each $R^{4b}$ independently represents a hydrogen atom or a methyl group, and from the viewpoint of achieving action effects of the present invention more effectively and reliably, it preferably represents a hydrogen atom. s represents an integer of 1 or more, is preferably 1 to 100, and is more preferably 1 to 10.)

Specific examples of the compound represented by the formula (B1) include bis(4-maleimidophenyl)methane, 2,2-bis{4-(4-maleimidophenoxy)-phenyl}propane, bis(3-ethyl-5-methyl-4-maleimidophenyl)methane, and the like.

As the maleimide compound (B), commercial products may be used, or preparation products prepared by publicly known methods may be used. Examples of the commercial products of the maleimide compound (B) include products from K•I Chemical Industry Co., LTD., "BMI-70" and "BMI-80", products from Daiwa Kasei Industry Co., Ltd., "BMI-1000P", "BMI-3000", "BMI-4000", "BMI-5100", "BMI-7000", and "BMI-2300", and the like.

The content of the maleimide compound (B) is preferably 5 to 50 parts by mass based on 100 parts by mass of the resin solid content, more preferably 8 to 40 parts by mass, and still more preferably 10 to 30 parts by mass, from the viewpoint of being excellent in the glass transition temperature (Tg) and heat resistance.

(Epoxy Compound (C))

The resin composition of the present embodiment contains an epoxy compound (C). Examples of the epoxy compound (C) include epoxy compounds having two or more epoxy groups in one molecule. Examples of such epoxy compounds include, but are not particularly limited to, for example, bisphenol-based epoxy resins (for example, bisphenol A-based epoxy resins, bisphenol E-based epoxy resins, bisphenol F-based epoxy resins, and bisphenol S-based epoxy resins), diallyl bisphenol-based epoxy resins (for example, diallyl bisphenol A-based epoxy resins, diallyl bisphenol E-based epoxy resins, diallyl bisphenol F-based epoxy resins, and diallyl bisphenol S-based epoxy resins), phenol novolac-based epoxy resins (for example, phenol novolac-based epoxy resins, bisphenol A novolac-based epoxy resins, and cresol novolac-based epoxy resins), aralkyl-based epoxy resins, biphenyl-based epoxy resins containing a biphenyl skeleton, naphthalene-based epoxy resins containing a naphthalene skeleton, anthracene-based epoxy resins containing an anthracene skeleton, glycidyl ester-based epoxy resins, polyol-based epoxy resins, isocyanurate ring containing epoxy resins, dicyclopentadiene-based epoxy resins, epoxy resins formed of a bisphenol A-based structural unit and a hydrocarbon-based structural unit, and halogen compounds thereof. These epoxy compounds are used alone, or used in combination of two or more kinds.

Among the above, the epoxy compound (C) is preferably one or more selected from the group consisting of aralkyl-based epoxy resins and naphthalene-based epoxy resins from the viewpoint of being further excellent in the coefficient of linear thermal expansion (CTE), glass transition temperature (Tg), copper foil peel strength, and heat resistance, and it is more preferably a naphthalene-based epoxy resin.

(Aralkyl-Based Epoxy Resin)

Examples of the aralkyl-based epoxy resin include, for example, a compound represented by the following formula (C1).

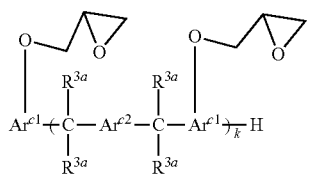
(C1)

(In the formula (C1), each $Ar^{c1}$ independently represents a benzene ring or a naphthalene ring, $Ar^{c2}$ represents a benzene ring, a naphthalene ring, or a biphenyl ring, each $R^{3a}$ independently represents a hydrogen atom or a methyl group, k represents an integer of 1 to 50, and each ring optionally has a substituent other than a glycidyloxy group (for example, an alkyl group having 1 to 5 carbon atoms or a phenyl group).)

In the formula (C1), k represents an integer of 1 to 50, and from the viewpoint of achieving action effects of the present invention more effectively and reliably, it preferably represents an integer of 1 to 10, more preferably represents an integer of 1 to 6, and is particularly preferably 1 to 3.

Note that, when the aralkyl-based epoxy resin comprises a compound represented by the formula (C1), it may comprise multiple kinds of compounds with the same k, or may comprise multiple kinds of compounds with different k. When the aralkyl-based epoxy resin comprises multiple kinds of compounds with different k, it preferably comprises compounds wherein k is 1 to 3 in the formula (C1).

It is preferable that the compound represented by the formula (C1) should be a compound wherein, in the formula (C1), $Ar^{c1}$ is a naphthalene ring and $Ar^{c2}$ is a benzene ring (also referred to as a "naphthalene aralkyl-based epoxy resin") or a compound wherein $Ar^{c1}$ is a benzene ring and $Ar^{c2}$ is a biphenyl ring (also referred to as a "biphenyl aralkyl-based epoxy resin") from the viewpoint that it is further excellent in the coefficient of linear thermal expansion (CTE), heat resistance, and low water absorption.

It is preferable that the biphenyl aralkyl-based epoxy resin should be a compound represented by the following formula (C2) from the viewpoint that it is further excellent in the coefficient of linear thermal expansion (CTE), heat resistance, and low water absorption.

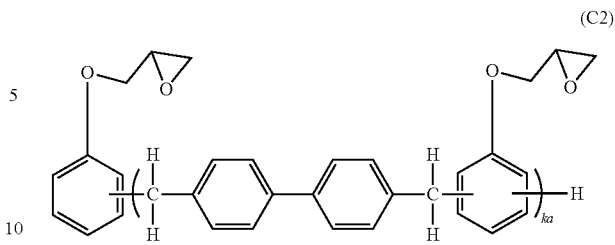
(C2)

(In the formula (C2), ka represents an integer of 1 to 10.)

Alternatively, the aralkyl-based epoxy resin may be a compound represented by the following formula (C3) or the following formula (C4).

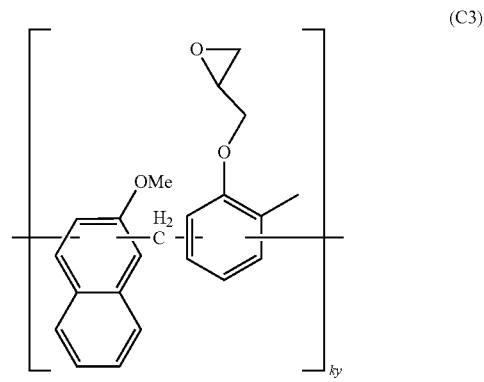
(C3)

(In the formula (C3), ky represents an integer of 1 to 10.)

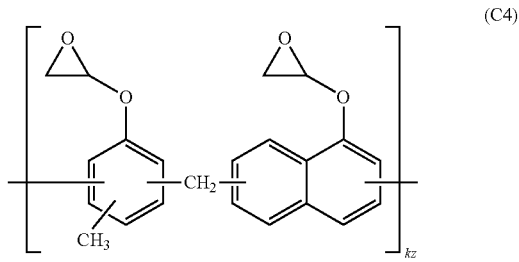
(C4)

(In the formula (C4), kz represents an integer of 1 to 10.)

As the aralkyl-based epoxy resin, commercial products may be used, or preparation products prepared by publicly known methods may be used. Examples of the commercial products of the naphthalene aralkyl-based epoxy resin include, for example, products from NIPPON STEEL & SUMIKIN CHEMICAL CO., LTD., "Epotohto (registered trademark) ESN-155", "Epotohto (registered trademark) ESN-355", "Epotohto (registered trademark) ESN-375", "Epotohto (registered trademark) ESN-475V", "Epotohto (registered trademark) ESN-485", and "Epotohto (registered trademark) ESN-175", products from Nippon Kayaku Co., Ltd., "NC-7000", "NC-7300", and "NC-7300L", products from DIC Corporation, "HP-5000" and "HP-9900", and the like. Examples of the commercial products of the biphenyl aralkyl-based epoxy resin include, for example, products from Nippon Kayaku Co., Ltd., "NC-3000", "NC-3000L", "NC-3000FH", and "NC-3000H", and the like.

(Naphthalene-Based Epoxy Resin)

Examples of the naphthalene-based epoxy resin include, but are not particularly limited to, for example, epoxy resins having a naphthalene skeleton, excluding the naphthalene aralkyl-based epoxy resins described above. Specific examples of the naphthalene-based epoxy resin include, for example, an epoxy resin represented by the following formula (C5), naphthylene ether-based epoxy resins, and the like. It is preferable that the naphthalene-based epoxy resin should be a naphthylene ether-based epoxy resin from the viewpoint that it is further excellent in the coefficient of linear thermal expansion (CTE), glass transition temperature (Tg), heat resistance, and low water absorption.

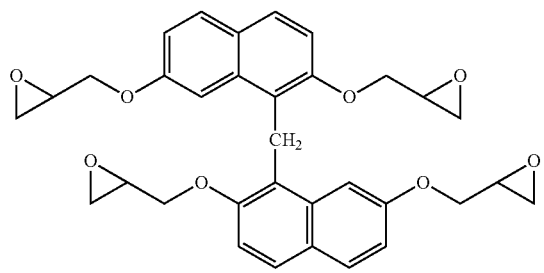

(C5)

As the epoxy resin represented by the above formula (C5), commercial products may be used, or preparation products prepared by publicly known methods may be used. Examples of the commercial products include a product from DIC Corporation, "HP-4710", and the like.

Examples of the naphthylene ether-based epoxy resin include, but are not particularly limited to, for example, a compound represented by the following formula (C6).

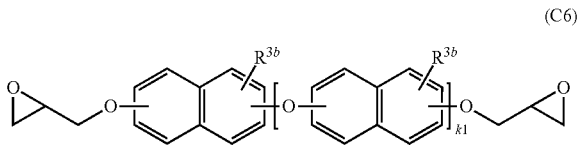

(C6)

(In the formula (C6), each $R^{3b}$ independently represents a hydrogen atom, an alkyl group having 1 to 5 carbon atoms, an aralkyl group, a benzyl group, a naphthyl group, or a naphthyl group containing a glycidyloxy group, and k1 represents an integer of 0 to 10.)

In the formula (C6), k1 represents an integer of 0 to 10, and from the viewpoint of achieving action effects of the present invention more effectively and reliably, it preferably represents an integer of 0 to 6, more preferably represents an integer of 0 to 4, and is particularly preferably 2 to 3.

In the formula (C6), it is preferable that each $R^{3b}$ should independently represent a hydrogen atom, an alkyl group having 1 to 5 carbon atoms, an aralkyl group, or a naphthyl group from the viewpoint of achieving action effects of the present invention more effectively and reliably.

In the compound represented by the formula (C6), the number of the glycidyloxy group containing an epoxy group in the molecule is preferably 2 to 6, and is more preferably 2 to 4.

Note that, when the naphthylene ether-based epoxy resin comprises a compound represented by the formula (C6), it may comprise multiple kinds of compounds with the same k1, or may comprise multiple kinds of compounds with different k1. When the naphthylene ether-based epoxy resin comprises multiple kinds of compounds with different k1, it preferably comprises compounds wherein k1 is 0 to 4 in the formula (C6), and more preferably comprises compounds wherein k1 is 2 to 3.

Examples of the compound represented by the formula (C6) include, but are not particularly limited to, for example, a compound represented by the formula (C7).

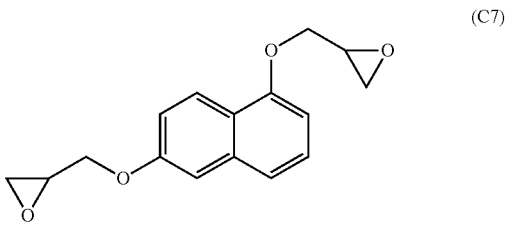 [SMILES: c1cc(OCC2CO2)c2ccc(OCC3CO3)cc2c1]

(C7)

As the naphthylene ether-based epoxy resin, commercial products may be used, or preparation products prepared by publicly known methods may be used. Examples of the commercial products of the naphthylene ether-based epoxy resin include, for example, products from DIC Corporation, "HP-4032", "HP-6000", "EXA-7300", "EXA-7310", "EXA-7311", "EXA-7311L", and "EXA-7311-G3", and the like.

The content of the epoxy compound (C) is not particularly limited and is preferably 5 to 50 parts by mass based on 100 parts by mass of the resin solid content, more preferably 20 to 45 parts by mass, still more preferably 25 to 40 parts by mass, and particularly preferably 25 to 35 parts by mass, from the viewpoint of being further excellent in the glass transition temperature (Tg), heat resistance, and coefficient of linear thermal expansion.

(Additional Thermosetting Compound)

The resin composition of the present embodiment may comprise an additional thermosetting compound other than the phenolic compound (A), the maleimide compound (B), and the epoxy compound (C). The term "thermosetting compound" here refers to a compound that can be cured by heating. Examples of the thermosetting compound include compounds having, in the molecule, at least one or more functional groups that are capable of undergoing a polymerization reaction or a crosslinking reaction with the same functional groups or different functional groups by heating (also referred to as "thermosetting functional groups"). Examples of the thermosetting functional group include, but are not particularly limited to, for example, a cyanate group (—O—C≡N), an allyl group, an alkenyl-substituted nadimide group, a hydroxy group, an amino group, an isocyanate group, other polymerizable unsaturated groups, and the like.

(Cyanate Compound)

The additional thermosetting compound may contain a cyanate compound. Examples of the cyanate compound include compounds having one or more cyanate groups (cyanate groups) in one molecule. Examples of the cyanate compound include, for example, aromatic hydrocarbon compounds containing two or more cyanate groups in one molecule, compounds in which two aromatic rings containing two or more cyanate groups are bonded via a linking group, novolac-based cyanates, bisphenol-based cyanate, diallyl bisphenol-based cyanates (for example, diallyl bisphenol A-based cyanates, diallyl bisphenol F-based cyanates, diallyl bisphenol E-based cyanates, diallyl bisphenol S-based cyanates, and the like), aralkyl-based cyanates, and prepolymers of these cyanates. These cyanate compounds are used alone, or used in combination of two or more kinds.

Examples of the aromatic hydrocarbon compound having two or more cyanate groups in one molecule include, for example, a compound represented by the formula (1).

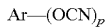

Formula (I):

(In the formula (1), Ar represents any of a benzene ring, a naphthalene ring, and a biphenyl ring, and p represents an integer of 2 or more.)

Examples of the compound wherein, in the formula (I), p is 2 include, but are not particularly limited to, for example, 1,3-dicyanatebenzene, 1,4-dicyanatebenzene, 1,3,5-tricyanatebenzene, 1,3-dicyanatenaphthalene, 1,4-dicyanatenaphthalene, 1,6-dicyanatenaphthalene, 1,8-dicyanatenaphthalene, 2,6-dicyanatenaphthalene, 2,7-dicyanatenaphthalene, 1,3,6-tricyanatenaphthalene, 4,4'-dicyanatebiphenyl, and the like.

Examples of the compound in which two aromatic rings containing two or more cyanate groups are bonded via a linking group include, but are not particularly limited to, for example, bis(4-cyanatephenyl)ether, bis(4-cyanatephenyl)thioether, bis(4-cyanatephenyl)sulfone, and the like.

Examples of the novolac-based cyanate include, for example, a compound represented by the following formula (1x).

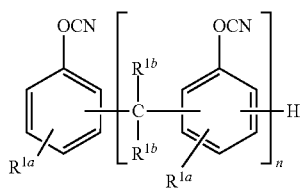

(1x)

(In the formula (1x), each aromatic ring is optionally substituted with a plurality of $R^{1a}$, each of which independently represents a hydrogen atom or an alkyl group having 1 to 5 carbon atoms, each $R^{1b}$ independently represents a hydrogen atom or a methyl group (preferably, a hydrogen atom), and n represents an integer of 1 to 10.)

In the formula (1x), n is an integer of 1 to 10, and from the viewpoint of achieving action effects of the present invention more effectively and reliably, it is preferably an integer of 1 to 6.

Note that, when the novolac-based cyanate comprises a compound represented by the formula (1x), it may comprise multiple kinds of compounds with the same n, or may comprise multiple kinds of compounds with different n.

Examples of the compound represented by the formula (1x) include, but are not particularly limited to, for example, bis(3,5-dimethyl 4-cyanatephenyl)methane, bis(4-cyanatephenyl)methane, 2,2'-bis(4-cyanatephenyl)propane, and the like.

Examples of the bisphenol-based cyanate include, but are not particularly limited to, for example, compounds formed by substituting the hydrogen atom of a phenolic hydroxy group of the bisphenols exemplified in the section of the phenolic compound with a cyano group (—C≡N). Specific examples thereof include, bisphenol A-based cyanates, bisphenol E-based cyanates, bisphenol F-based cyanates, bisphenol AD-based cyanates, bisphenol B-based cyanates, bisphenol AP-based cyanates, bisphenol S-based cyanates, bisphenol Z-based cyanates, bisphenol TMC-based cyanates, and the like.

As the bisphenol-based cyanate, commercial products may be used, or preparation products prepared by publicly known methods may be used. Examples of the commercial products of the bisphenol-based cyanate include, for example, a product from Mitsubishi Gas Chemical Company, Inc., "CA210", and the like.

Examples of the aralkyl-based cyanate include, but are not particularly limited to, for example, naphthol aralkyl-based cyanates, biphenyl aralkyl-based cyanates, and the like.

Examples of the naphthol aralkyl-based cyanate include, for example, a compound represented by the following formula (1a).

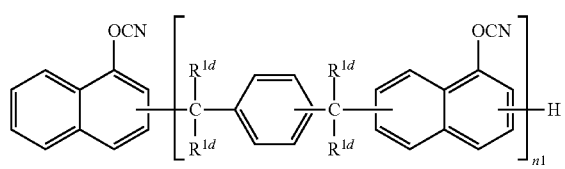

(1a)

(In the formula (1a), each $R^{1d}$ independently represents a hydrogen atom or a methyl group (preferably a hydrogen atom), and n1 represents an integer of 1 to 10.)

In the formula (1a), n1 is an integer of 1 to 10, and from the viewpoint of achieving action effects of the present invention more effectively and reliably, it is preferably an integer of 1 to 6.

Note that, when the naphthol aralkyl-based cyanate comprises a compound represented by the formula (1a), it may comprise multiple kinds of compounds with the same n1, or may comprise multiple kinds of compounds with different n1.

Examples of the biphenyl aralkyl-based cyanate include, for example, a compound represented by the following formula (1b).

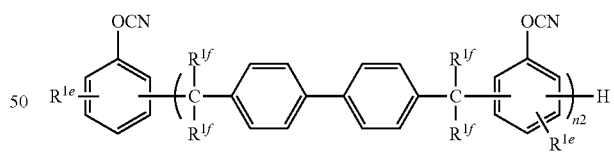

(1b)

(In the formula (1b), each $R^{1e}$ independently represents a hydrogen atom or an alkyl group having 1 to 5 carbon atoms, each $R^{1f}$ independently represents a hydrogen atom or a methyl group (preferably, a hydrogen atom), and n2 represents an integer of 1 to 10.)

In the formula (1b), n2 represents an integer of 1 to 10, and from the viewpoint of achieving action effects of the present invention more effectively and reliably, it preferably represents an integer of 1 to 6.

Note that, when the biphenyl aralkyl-based cyanate comprises a compound represented by the formula (1b), it may comprise multiple kinds of compounds with the same n2, or may comprise multiple kinds of compounds with different n2.

As the aralkyl-based cyanate, commercial products may be used, or products synthesized by publicly known methods may be used. Examples of the method for synthesizing the aralkyl-based cyanate include, for example, a method in which a phenolic resin corresponding to the target aralkyl-based cyanate (hereinafter, also referred to as a "corresponding phenolic resin"), a cyanogen halide, and a basic compound are allowed to react in an inert organic solvent, a method in which a salt formed by allowing the corresponding phenolic resin to react with a basic compound in an aqueous solution and a cyanogen halide are subjected to a two phase system interfacial reaction, and the like. In either method, the aralkyl-based cyanate can be obtained by cyanation of the hydrogen atom of a phenolic hydroxy group of the corresponding phenolic resin. In more detail, for example, the method described in Examples and the like are used.

The content of the cyanate compound may be 30 parts by mass or less (for example, 0 parts by mass or more and 30 parts by mass or less) based on 100 parts by mass of the resin solid content, and from the viewpoint of achieving action effects of the present invention more effectively and reliably, it is preferably 15 parts by mass or less, more preferably 10 parts by mass or less, and still more preferably 5 parts by mass or less.

(Alkenyl-Substituted Nadimide Compound)

The additional thermosetting compound may contain an alkenyl-substituted nadimide compound. Examples of the alkenyl-substituted nadimide compound include, for example, compounds having one or more alkenyl-substituted nadimide groups in the molecule. Examples of the alkenyl-substituted nadimide compound include, for example, a compound represented by the following formula (5a).

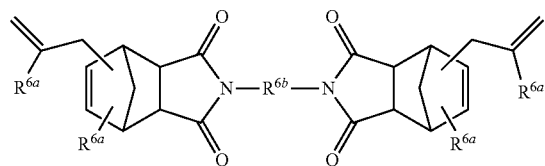

(5a)

(In the formula (5a), each $R^{6a}$ independently represents a hydrogen atom or an alkyl group having 1 to 6 carbon atoms, and $R^{6b}$ represents an alkylene group having 1 to 6 carbon atoms, a phenylene group, a biphenylene group, a naphthylene group, or a group represented by the following formula (5b) or (5c).)

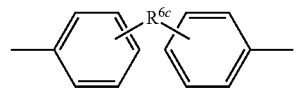

(5b)

(In the formula (5b), $R^{6c}$ represents a methylene group, an isopropylidene group, or a substituent represented by CO, O, S, or $SO_2$.)

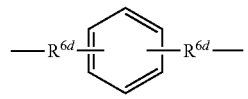

(5c)

(In the formula (5c), each $R^{6d}$ independently represents an alkylene group having 1 to 4 carbon atoms or a cycloalkylene group having 5 to 8 carbon atoms.)

In addition, examples of the alkenyl-substituted nadimide compound also include a compound represented by the following formula (12) and/or (13).

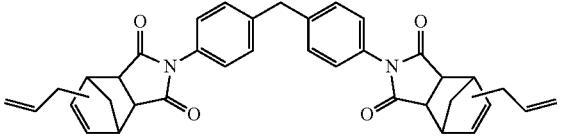

(12)

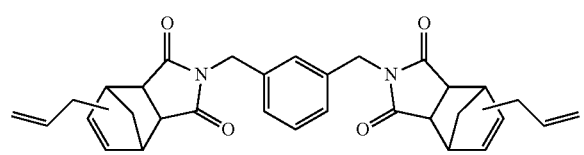

(13)

As the alkenyl-substituted nadimide compound, commercial products may be used, or preparation products prepared by publicly known methods may be used. Examples of the commercial products of the alkenyl-substituted nadimide compound include, but are not particularly limited to, for example, products from Maruzen Petrochemical Co., Ltd., "BANI-M" and "BANI-X", and the like.

It is preferable that the alkenyl-substituted nadimide compound should comprise a bifunctional alkenyl-substituted nadimide compound. The "bifunctional alkenyl-substituted nadimide compound" in the present specification refers to a compound having two alkenyl-substituted nadimide groups in one molecule (the number of alkenyl-substituted nadimide groups in one molecule is two).

The content of the alkenyl-substituted nadimide compound may be 30 parts by mass or less (for example, 0 parts by mass or more and 30 parts by mass or less) based on 100 parts by mass of the resin solid content, and from the viewpoint of achieving action effects of the present invention more effectively and reliably, it is preferably 15 parts by mass or less, more preferably 10 parts by mass or less, and still more preferably 5 parts by mass or less.

(Additional Resin)

The resin composition of the present embodiment may contain an additional resin, which will be shown below, if required. Examples of the additional resin include compounds having a polymerizable unsaturated group, oxetane resins, benzoxazine compounds, and the like.

Examples of the compound having a polymerizable unsaturated group include, but are not particularly limited to, for example, vinyl compounds such as ethylene, propylene, styrene, divinylbenzene, and divinylbiphenyl; (meth)acrylates of monohydric or polyhydric alcohols such as methyl (meth)acrylate, 2-hydroxyethyl (meth)acrylate, 2-hydroxypropyl (meth)acrylate, polypropylene glycol di(meth)acrylate, trimethylolpropane di(meth)acrylate, trimethylolpropane tri(meth)acrylate, pentaerythritol tetra(meth)acrylate, and dipentaerythritol hexa(meth)acrylate; epoxy (meth) acrylates such as bisphenol A-based epoxy (meth)acrylate and bisphenol F-based epoxy (meth)acrylate; benzocyclobutene resins; and the like.

Examples of the oxetane resin include, but are not particularly limited to, for example, oxetane, alkyloxetanes such as 2-methyloxetane, 2,2-dimethyloxetane, 3-methyloxetane, and 3,3-dimethyloxetane, 3-methyl-3-methoxymethyloxetane, 3,3'-di(trifluoromethyl)perfluoxetane, 2-chloromethyloxetane, 3,3-bis(chloromethyl)oxetane, biphenyl-based oxetanes, products from Toagosei Co., Ltd., "OXT-101" and "OXT-121", and the like.

The benzoxazine compound is not particularly limited as long as it is a compound having two or more dihydrobenzoxazine rings in one molecule, and examples thereof include, for example, products from KONISHI CHEMICAL INC CO., LTD., "bisphenol F-based benzoxazine BF-BXZ" and "bisphenol S-based benzoxazine BS-BXZ", and the like.

(Inorganic Filler (E))

The resin composition of the present embodiment contains an inorganic filler (E). Examples of the inorganic filler (E) include, but are not particularly limited to, silicas, silicon compounds (for example, white carbon and the like), metal oxides (for example, alumina, titanium white, zinc oxide, magnesium oxide, zirconium oxide, and the like), metal nitrides (for example, boron nitride, aggregated boron nitride, silicon nitride, aluminum nitride, and the like), metal sulfates (for example, barium sulfate and the like), metal hydroxides (for example, aluminum hydroxide, heat treated products of aluminum hydroxide (for example, products obtained by subjecting aluminum hydroxide to a heat treatment to reduce a part of crystal water), boehmite, magnesium hydroxide, and the like), molybdenum compounds (for example, molybdenum oxide, zinc molybdate, and the like), zinc compounds (for example, zinc borate, zinc stannate, and the like), clay, kaolin, talc, calcined clay, calcined kaolin, calcined talc, mica, E-glass, A-glass, NE-glass, C-glass, L-glass, D-glass, S-glass, M-glass G20, glass short fibers (including glass fine powders such as E glass, T glass, D glass, S glass, and Q glass), hollow glass, spherical glass, and the like. These inorganic fillers are used alone, or used in combination of two or more kinds. Among the above, the inorganic filler (E) is preferably at least one selected from the group consisting of silica, metal hydroxides, and metal oxides from the viewpoint of being further excellent in the coefficient of linear thermal expansion (CTE), flexural modulus, and flame retardance. It is more preferable that the inorganic filler (E) should comprise at least one selected from the group consisting of silica, boehmite, and alumina, and it is still more preferably silica.

Examples of the silicas include, for example, natural silica, fused silica, synthetic silica, amorphous silica, Aerosil, hollow silica, and the like. Among the above, fused silica is preferable.

The content of the inorganic filler (E) is 100 to 250 parts by mass based on 100 parts by mass of the resin solid content. When the content of the inorganic filler (E) is 100 parts by mass or more, the coefficient of linear thermal expansion (CTE), flexural modulus, and flame retardance are excellent. When the content of the inorganic filler (E) is greater than 250 parts by mass, sufficient flow properties are not obtained, forming becomes difficult, and the resin composition is not suited for the application of printed wiring boards. From the same viewpoint, the content of the inorganic filler (E) is preferably 120 to 230 parts by mass, more preferably 140 to 210 parts by mass, and still more preferably 150 to 200 parts by mass.

(Organic Filler (I))

The resin composition of the present embodiment may contain an organic filler (I). Examples of the organic filler include, for example, rubber powders such as styrene-based powder, butadiene-based powder, and acryl-based powder; core shell-type rubber powders; silicone-based powders, and the like. These organic fillers are used alone, or used in combination of two or more kinds. Among the above, silicone-based powders are preferable.

Examples of the silicone-based powders include, for example, silicone resin powder, silicone rubber powder, silicone composite powder, and the like. Among the above, silicone composite powder is preferable.

The content of the organic filler (I) is preferably 10 to 35 parts by mass based on 100 parts by mass of the resin solid content, more preferably 15 to 30 parts by mass, and still more preferably 20 to 25 parts by mass.

(Silane Coupling Agent (G))

The resin composition of the present embodiment may further contain a silane coupling agent (G). When the resin composition of the present embodiment contains a silane coupling agent (G), it tends to be further excellent in the dispersibility of the inorganic filler (E) and in the adhesive strength between each component in the resin composition of the present embodiment and a base material, which will be mentioned later.

Examples of the silane coupling agent (G) include silane coupling agents that are generally used for a surface treatment of inorganic matters, and include aminosilane-based compounds (for example, γ-aminopropyltriethoxysilane, N-β-(aminoethyl)-γ-aminopropyltrimethoxysilane, and the like), epoxysilane-based compounds (for example, γ-glycidoxypropyltrimethoxysilane and the like), acrylsilane-based compounds (for example, γ-acryloxypropyltrimethoxysilane and the like), cationic silane-based compounds (for example, N-β-(N-vinylbenzylaminoethyl)-γ-aminopropyltrimethoxysilane hydrochloride and the like), phenylsilane-based compounds, and the like. These silane coupling agents are used alone, or used in combination of two or more kinds. Among the above, it is preferable that the silane coupling agent (G) should be an epoxysilane-based compound. Examples of the epoxysilane-based compound include, for example, products from Shin-Etsu Chemical Co., Ltd., "KBM-403", "KBM-303", "KBM-402", and "KBE-403", and the like.

The content of the silane coupling agent (G) may be approximately 0.1 to 10.0 parts by mass based on 100 parts by mass of the resin solid content, and is preferably 0.5 to 8.0 parts by mass and more preferably 1.0 to 6.0 parts by mass.

(Wetting and Dispersing Agent (H))

The resin composition of the present embodiment may further contain a wetting and dispersing agent (H). When the resin composition of the present embodiment contains a wetting and dispersing agent (H), it tends to be further excellent in the dispersibility of the inorganic filler (E).

The wetting and dispersing agent (H) is not limited as long as it is a publicly known dispersing agent (dispersion stabilizer) that is used for dispersing the inorganic filler (E), and examples thereof include, for example, DISPER BYK-110, 111, 118, 180, 161, BYK-W996, W9010, and W903 manufactured by BYK Japan KK., and the like.

The content of the wetting and dispersing agent (H) is preferably 0.1 to 5.0 parts by mass based on 100 parts by mass of the resin solid content, more preferably 0.2 to 3.0 parts by mass, and still more preferably 0.5 to 1.5 parts by mass, from the viewpoint of being further excellent in the dispersibility of the inorganic filler (E).

(Cyclic Carbodiimide Compound (D))

The resin composition of the present embodiment contains a cyclic carbodiimide compound (D). Examples of the cyclic carbodiimide compound (D) include, for example, compounds having one or more cyclic structures in the molecule and having one carbodiimide group in one cyclic structure. The cyclic carbodiimide compound has one or more cyclic structures in the molecule and has one carbodiimide group in one cyclic structure. The resin composition contains the cyclic carbodiimide compound (D), which gives the resin composition a higher glass transition temperature, excellent heat resistance, and excellent electrical properties while maintaining sufficient moldability without worsening the flow properties.

The cyclic structure has a carbodiimide group (—N=C=N—), and the first nitrogen atom and the second nitrogen atom therein are bonded via a bonding group.

The number of atoms forming the cyclic structure is preferably 8 to 50, more preferably 10 to 30, and still more preferably 10 to 20. Here, the number of atoms forming the cyclic structure refers to the number of atoms that directly constitute the cyclic structure. For example, when the cyclic structure is an 8-membered ring, the number of atoms forming the cyclic structure is 8, and when it is a 50-membered ring, the number of atoms forming the cyclic structure is 50. When the number of atoms forming the cyclic structure is 8 or more, the cyclic carbodiimide compound has the advantages of good stability, easy storage, and ease of use. In addition, it is difficult to synthesize a cyclic carbodiimide compound in which the number of atoms forming the cyclic structure is greater than 50.

It is preferable that the cyclic carbodiimide compound (D) should contain a cyclic structure represented by the following formula (1).

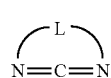
(1)

(In the formula (1), L is a divalent to tetravalent bonding group, which is an aliphatic group, an alicyclic group, an aromatic group, or a group formed by combining them. The bonding group optionally contains a heteroatom and/or a substituent.)

The heteroatom refers to O, N, S, and P. In the bonding group, two valences are used for forming the cyclic structure. When L is a trivalent or tetravalent bonding group, L is bonded to the polymer or another cyclic structure via a single bond, a double bond, an atom, or a group of atoms.

(Bonding Group L)

It is preferable that the bonding group L should be a divalent to tetravalent bonding group represented by the following formula (1-1), (1-2), or (1-3).

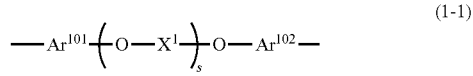
(1-1)

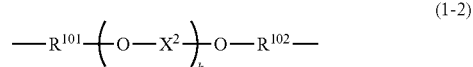
(1-2)

(1-3)

In the formula (1-1), $Ar^{101}$ and $Ar^{102}$ are each independently a divalent to tetravalent aromatic hydrocarbon group having 5 to 15 carbon atoms and optionally having a heteroatom and a substituent.

Examples of the aromatic hydrocarbon group represented by $Ar^{101}$ and $Ar^{102}$ include, but are not particularly limited to, for example, an arylene group having 5 to 15 carbon atoms, an arenetriyl group having 5 to 15 carbon atoms, and arenetetrayl group having 5 to 15 carbon atoms, all of which optionally have a heterocyclic structure containing a heteroatom. Here, examples of the arylene group (divalent) include a phenylene group, a naphthalenediyl group, and the like. Examples of the arenetriyl group (trivalent) include a benzenetriyl group, a naphthalenetriyl group, and the like. Examples of the arenetetrayl group (tetravalent) include a benzenetetrayl group, a naphthalenetetrayl group, and the like. These aromatic hydrocarbon groups may have a substituent. Examples of the substituent include an alkyl group having 1 to 20 carbon atoms, an aryl group having 6 to 15 carbon atoms, a halogen atom, a nitro group, an amide group, a hydroxyl group, an ester group, an ether group, an aldehyde group, and the like.

$Ar^{101}$ and $Ar^{102}$ are each preferably a phenylene group, a naphthalenediyl group, a benzenetriyl group, a naphthalenetriyl group, or a benzenetetrayl group, and are each more preferably a phenylene group or a benzenetriyl group.

In the formula (1-2), examples of $R^{101}$ and $R^{102}$ each independently include a divalent to tetravalent aliphatic group (aliphatic hydrocarbon group) having 1 to 20 carbon atoms, a divalent to tetravalent alicyclic group (alicyclic hydrocarbon group) having 3 to 20 carbon atoms, and a combination thereof, or a combination of these aliphatic groups and/or alicyclic groups with a divalent to tetravalent aromatic group (aromatic hydrocarbon group) having 5 to 15 carbon atoms.

Examples of the aliphatic group represented by $R^{101}$ and $R^{102}$ include, but are not particularly limited to, for example, an alkylene group having 1 to 20 carbon atoms, an alkanetriyl group having 1 to 20 carbon atoms, an alkanetetrayl group having 1 to 20 carbon atoms, and the like. Examples of the alkylene group include a methylene group, an ethylene group, a propylene group, a butylene group, a pentylene group, a hexylene group, a heptylene group, an octylene group, a nonylene group, a decylene group, a dodecylene group, a hexadecylene group, and the like. Examples of the alkanetriyl group include a methanetriyl group, an ethanetriyl group, a propanetriyl group, a butanetriyl group, a pentanetriyl group, a hexanetriyl group, a heptanetriyl group, an octanetriyl group, a nonanetriyl group, a decanetriyl group, a dodecanetriyl group, a hexadecanetriyl group, and the like. Examples of the alkanetetrayl group include a methanetetrayl group, an ethanetetrayl group, a propanetetrayl group, a butanetetrayl group, a pentanetetrayl group, a hexanetetrayl group, a heptanetetrayl group, an octanetetrayl group, a nonanetetrayl group, a decanetetrayl group, a dodecanetetrayl group, a hexadecanetetrayl group, and the like. These aliphatic groups may have a substituent. Examples of the substituent include an alkyl group having 1 to 20 carbon atoms, an aryl group having 6 to 15 carbon atoms, a halogen atom, a nitro group, an amide group, a hydroxyl group, an ester group, an ether group, an aldehyde group and the like.

Examples of the alicyclic group include a cycloalkylene group having 3 to 20 carbon atoms, a cycloalkanetriyl group having 3 to 20 carbon atoms, and a cycloalkanetetrayl group having 3 to 20 carbon atoms. Examples of the cycloalkylene group include a cyclopropylene group, a cyclobutylene group, a cyclopentylene group, a cyclohexylene group, a cycloheptylene group, a cyclooctylene group, a cyclononylene group, a cyclodecylene group, a cyclododecylene group, a cyclohexadecylene group, and the like. Examples of the cycloalkanetriyl group include a cyclopropanetriyl group, a cyclobutanetriyl group, a cyclopentanetriyl group, a cyclohexanetriyl group, a cycloheptanetriyl group, a cyclooctanetriyl group, a cyclononanetriyl group, a cyclodecanetriyl group, a cyclododecanetriyl group, a cyclohexadecanetriyl group, and the like. Examples of the cycloalkanetetrayl group include a cyclopropanetetrayl group, a cyclobutanetetrayl group, a cyclopentanetetrayl group, a cyclohexanetetrayl group, a cycloheptanetetrayl group, a cyclooctanetetrayl group, a cyclononanetetrayl group, a cyclodecanetetrayl group, a cyclododecanetetrayl group, a cyclohexadecanetetrayl group, and the like. These alicyclic groups may have a substituent. Examples thereof include an alkyl group having 1 to 20 carbon atoms, an aryl group having 6 to 15 carbon atoms, a halogen atom, a nitro group, an amide group, a hydroxyl group, an ester group, an ether group, an aldehyde group, and the like.

Examples of the aromatic group include an arylene group having 5 to 15 carbon atoms, an arenetriyl group having 5 to 15 carbon atoms, and arenetetrayl group having 5 to 15 carbon atoms, all of which optionally have a heterocyclic structure containing a heteroatom. Examples of the arylene group include a phenylene group, a naphthalenediyl group, and the like. Examples of the arenetriyl group (trivalent) include a benzenetriyl group, a naphthalenetriyl group and the like. Examples of the arenetetrayl group (tetravalent) include a benzenetetrayl group, a naphthalenetetrayl group and the like. These aromatic groups may have a substituent. Examples thereof include an alkyl group having 1 to 20 carbon atoms, an aryl group having 6 to 15 carbon atoms, a halogen atom, a nitro group, an amide group, a hydroxyl group, an ester group, an ether group, an aldehyde group and the like.

It is preferable that $R^{101}$ and $R^{102}$ should be each independently a methylene group, an ethylene group, a vinylidene group, a phenylene group, or an ether group, and it is more preferable that they should be each independently a methylene group, a phenylene group, or an ether group.

In the formulas (1-1) and (1-2), $X^1$ and $X^2$ are each independently a divalent to tetravalent aliphatic group having 1 to 20 carbon atoms, a divalent to tetravalent alicyclic group having 3 to 20 carbon atoms, a divalent to tetravalent aromatic group having 5 to 15 carbon atoms, or a combination thereof, all of which optionally have a heteroatom and/or a substituent.

Examples of the aliphatic group, the alicyclic group, and the aromatic group in $X^1$ and $X^2$ include those that are the same as exemplified for the above $R^{101}$ and $R^{102}$. It is preferable that $X^1$ and $X^2$ should be each a methylene group, an ethylene group, a vinylidene group, or an ether group, and it is more preferable that they should be each a methylene group or an ether group.

In the formulas (1-1) and (1-2), it is preferable that s and k should be each independently 0 to 10, more preferably 0 to 3, and still more preferably 0 to 1. The synthesis of a cyclic carbodiimide compound in which s and k are each greater than 10 is difficult and the cost is increased. Note that, when s or k is 2 or more, $X^1$ or $X^2$ as a repeating unit may be different from another $X^1$ or $X^2$.

In the formula (1-3), $X^3$ is a divalent to tetravalent aliphatic group having 1 to 20 carbon atoms, a divalent to tetravalent alicyclic group having 3 to 20 carbon atoms, a divalent to tetravalent aromatic group having 5 to 15 carbon atoms, or a combination thereof, all of which optionally have a heteroatom and/or a substituent.

Examples of the aliphatic group, the alicyclic group, and the aromatic group in $X^3$ include those that are the same as exemplified for the above $R^{101}$, $R^{102}$, $X^1$, and $X^2$. It is preferable that $X^3$ should be a methylene group, an ethylene group, a vinylidene group, or an ether group, and it is more preferable that $X^3$ should be a methylene group or an ether group.

In addition, $Ar^{101}$, $Ar^{102}$, $R^{101}$, $R^{102}$, $X^1$, $X^2$, and $X^3$ may have a heteroatom selected from an O atom, a N atom, a S atom, and a P atom. However, when the heteroatom is a N atom, that N atom exists as a nitro group and/or an amide group.

In addition, when L is a divalent bonding group, all of $Ar^{101}$, $Ar^{102}$, $R^{101}$, $R^{102}$, $X^1$, $X^2$, and $X^3$ are divalent groups. When L is a trivalent bonding group, one of $Ar^{101}$, $Ar^{102}$, $R^{101}$, $R^{102}$, $X^1$, $X^2$, and $X^3$ is a trivalent group. When L is a tetravalent bonding group, one of $Ar^{101}$, $Ar^{102}$, $R^{101}$, $R^{102}$, $X^1$, $X^2$, and $X^3$ is a tetravalent group, or two of $Ar^{101}$, $Ar^{102}$, $R^{101}$, $R^{102}$, $X^1$, $X^2$, and $X^3$ are trivalent groups.

Examples of the aspect in which L is a trivalent or tetravalent bonding group and L is bonded to another cyclic structure having a carbodiimide group include an aspect in which two or more cyclic structures represented by the formula (1) are bonded via a shared part having 1 to 15 (preferably 1 to 12) carbon atoms selected from a spiro ring structure, a single bond, an alkylene group having 1 to 10 carbon atoms, an aromatic ring structure having 6 to 10 carbon atoms, a cycloalkane ring structure having 4 to 12 carbon atoms, and the like. Specific examples of such an aspect will be shown in the following formulas (2), (4), and (5).

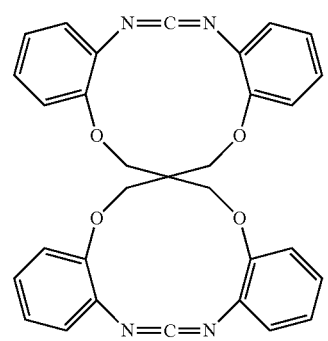

(2)

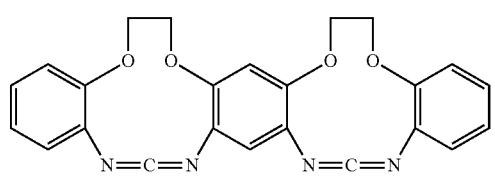

(4)

(5)

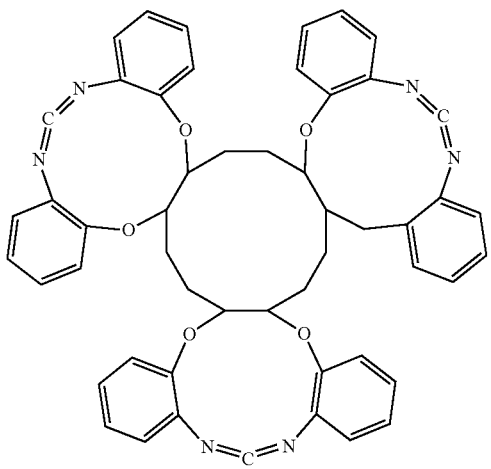

The cyclic carbodiimide compound (D) may be a cyclic carbodiimide compound represented by the following formula (i). Note that the cyclic carbodiimide compound represented by the following formula (i) may have two or more carbodiimide groups in the molecule, or may have one carbodiimide group.

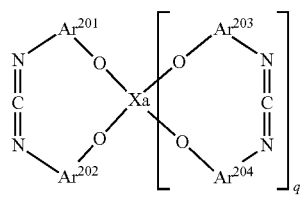

(i)

(In the formula (i), Xa is a divalent group represented by any of the following formulas (i-1) to (i-3), or a tetravalent group represented by the following formula (i-4). When Xa is divalent, q is 0, and when Xa is tetravalent, q is 1. $Ar^{201}$ to $Ar^{214}$ are each independently an aromatic hydrocarbon group. These aromatic hydrocarbon groups may have an alkyl group having 1 to 6 carbon atoms or a phenyl group as a substituent.)

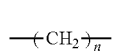

(i-1)

(In the formula (i-1), n is an integer of 1 to 6.)

(i-2)

(In the formula (i-2), m and n are each independently an integer of 0 to 3.)

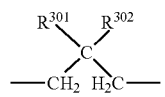

(i-3)

(In the formula (i-3), $R^{301}$ and $R^{312}$ each independently represent an alkyl group having 1 to 6 carbon atoms or a phenyl group.)

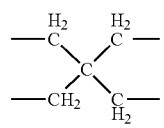

(i-4)

In addition, as the cyclic carbodiimide compound represented by the above formula (i), several compounds having the following structural formula are exemplified.

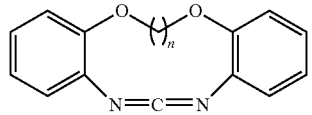

(n = an integer of 1 to 6)

It is preferable that the cyclic carbodiimide compound (D) should comprise a polyvalent cyclic carbodiimide compound containing two or more carbodiimide groups in one molecule from the viewpoint of being further excellent in the glass transition temperature (Tg), chemical resistance, and heat resistance. It is more preferable that the cyclic carbodiimide compound (D) should comprise a polyvalent cyclic carbodiimide compound containing two or three carbodiimide groups in one molecule from the viewpoint of being further excellent in the curing performance. These polyvalent cyclic carbodiimide compounds are used alone, or used in combination of two or more kinds.

Examples of the polyvalent cyclic carbodiimide compound include, for example, among the carbodiimide compounds mentioned above, those containing two or more carbodiimide groups in one molecule. Among the above, a compound represented by the following formula (2) is preferable from the viewpoint of being further excellent in the glass transition temperature (Tg), chemical resistance, and heat resistance.

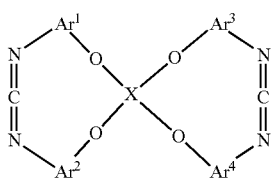

(2)

(In the formula (2), X is a tetravalent group represented by the following formula (3), $Ar^1$ to $Ar^4$ are each independently a divalent linking group, which is a phenylene group (for example, an ortho-phenylene group) or a naphthalene-diyl group (for example, 1,2-naphthalene-diyl group), and the linking group optionally has a substituent. Examples of the substituent include an alkyl group having 1 to 20 carbon atoms, an aryl group having 6 to 15 carbon atoms, a halogen atom, a nitro group, an amide group, a hydroxyl group, an ester group, an ether group, an aldehyde group, and the like. In addition, these linking groups optionally have a heterocyclic structure containing a heteroatom.)

(3)

The cyclic carbodiimide compound (D) is preferably a compound represented by the following formula (4) from the viewpoint of being further excellent in the heat resistance.

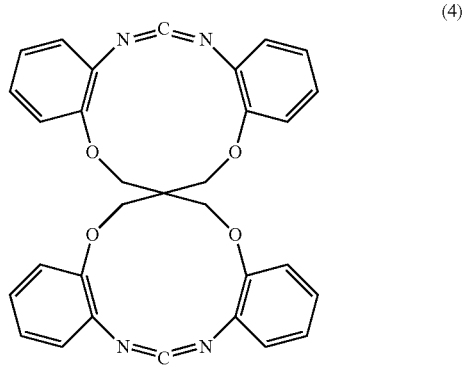 [SMILES: C1=Nc2ccccc2OCC2(COc3ccccc3N=1)COc1ccccc1N=C=Nc1ccccc1OC2]

(4)

These cyclic carbodiimide compounds (D) can be produced by publicly known methods (for example, a method described in International Publication No. WO 2010/071213).

The content of the cyclic carbodiimide compound (D) is preferably 1.0 to 30 parts by mass based on 100 parts by mass of the resin solid content, more preferably 2.0 to 15 parts by mass, and still more preferably 2.5 to 12.0 parts by mass. When the content of the cyclic carbodiimide compound (D) is 1.0 part by mass or more, the chemical resistance, heat resistance, and electrical properties tend to be further excellent, and when the content of the cyclic carbodiimide compound (D) is 30 parts by mass or less, the flame retardance tends to be further excellent.

(Curing Accelerator (F))

The resin composition further comprises a curing accelerator (F). Examples of the curing accelerator (F) include, but are not particularly limited to, for example, imidazole compounds, organophosphorus compounds, and the like.

It is preferable that the imidazole compound should comprise an imidazole compound represented by the following formula (5) from the viewpoint of being excellent in the curability.

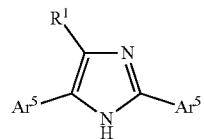

(5)

(In the formula (5), each $Ar^5$ independently represents a phenyl group, a naphthalene group, a biphenyl group, or an anthracene group, all of which optionally have a substituent, $R^1$ represents a hydrogen atom, an alkyl group or an aryl group, and when $R^1$ represents an alkyl group or an aryl group, it optionally has a substituent.)

$Ar^5$ is preferably a phenyl group. $R^1$ is preferably an aryl group, and is more preferably a phenyl group.

Examples of the imidazole compound represented by the formula (5) include, for example, 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, 2-phenyl-4-methyl-5-hydroxymethylimidazole, 2,4,5-triphenylimidazole, 2-phenyl-4-methylimidazole, and the like.

Among the above, the imidazole compound is preferably 2,4,5-triphenylimidazole and/or 2-phenyl-4-methylimidazole, and is more preferably 2,4,5-triphenylimidazole. When such an imidazole compound is used, the curability tends to be further improved.

In addition, examples of the organophosphorus compound include, but are not particularly limited to, for example, [4-(N,N-dimethylamino)phenyl]di-tert-butylphosphine, 1,1'-bis(di-iso-propylphosphino)ferrocene, 1,1'-bis(di-tert-butylphosphino)ferrocene, 1,1'-bis(diphenylphosphino)ferrocene, 1,2-bis(diphenylphosphino)ethane, 1,2-bis(diphenylphosphino)acetylene, 1,3-bis(diphenylphosphino) propane, 1,4-bis(diphenylphosphino)butane, 1,5-bis(diphenylphosphino)pentane, 2,2'-bis(diphenylphosphino) diphenyl ether, 2-carboxyethyltriphenylphosphonium bromide, 9,9-dimethyl-4,5-bis(di-tert-butylphosphino)-9H-xanthene, 9,9-dimethyl-4,5-bis(diphenylphosphino)-9H-xanthene, i-propyl triphenylphosphonium iodide, n-butyl di(tert-butyl)phosphonium tetrafluoroborate, n-butyl triphenylphosphonium bromide, n-propyl triphenylphosphonium bromide, p-tolyl triphenylphosphonium tetra-p-tolylborate, ethyl-2-(triphenylphosphanylidene)butanoate, ethyl-2-(triphenylphosphanylidene)propionate, ethyltriphenylphosphonium bromide, di-tert-butyl(2-butenyl)phosphine, di-tert-butyl(2-butenyl)phosphonium tetrafluoroborate, di-tert-butyl(3-methyl-2-butenyl)phosphine, di-tert-butyl(3-methyl-2-butenyl)phosphonium tetrafluoroborate, di-tert-butylphenylphosphine, di-tert-butylmethylphosphonium tetraphenylborate, di-tert-butylmethylphosphonium tetrafluoroborate, diphenyl-2-pyridylphosphine, diphenylcyclohexylphosphine, diphenylphosphinylhydroauinone, diphenylphosphinostyrene, tetra-n-butylphosphonium chloride, tetra-n-butylphosphonium hydroxide, tetra-n-butylphosphonium bromide, tetra-n-butylphosphonium laurate, tetra-n-butylphosphonium acetate, tetraphenylphosphonium tetrafluoroborate, tetraphenylphosphonium bromide, tetraphenylphosphonium tetra-p-tolylborate, tetraphenylphosphonium tetraphenylborate, tri-2,4-xylylphosphine, tri-2,5-xylylphosphine, tri-3,5-xylylphosphine, tri-m-tolylphosphine, tri-n-octylphosphine, tri-n-octylphosphine oxide, tri-n-butylphosphine, tri-o-tolylphosphine, tri-p-tolylphosphine, tri-tert-butylphosphine, tri-tert-butylphosphonium tetraphenylborate, tri-tert-butylphosphonium tetrafluoroborate, tricyclohexylphosphine, tris(o-methoxyphenyl)phosphine, tris(p-tert-butylphenyl)phosphine, tris(p-tert-butoxyphenyl) phosphine, tris(p-methoxyphenyl)phosphine, tris(diethylamino)phosphine, triphenylphosphine, triphenylphosphinetriphenylborane, triphenylphosphine oxide, bis(tetratetran-butylphosphonium)pyromellitate, benzyl triphenylphosphonium chloride, methyltriphenylphosphonium chloride, methyltriphenylphosphonium bromide, methoxymethyltriphenylphosphonium chloride, and the like.

Among the above, phenylphosphines such as triphenylphosphine, tri-o-tolylphosphine, tri-m-tolylphosphine, tri-p-tolylphosphine, tri-2,4-xylylphosphine, tri-2,5-xylylphosphine, tri-3,5-xylylphosphine, tris(p-tert-butylphenyl)phosphine, tris(p-methoxyphenyl)phosphine, tris(o-methoxyphenyl)phosphine, tris(p-tert-butoxyphenyl) phosphine, diphenylcyclohexylphosphine, and diphenyl-2-pyridylphosphine; and alkylphosphines such as tricyclohexylphosphine and tri-n-butylphosphine are preferable. When such an organophosphorus compound is used, in addition to the curability, the heat resistance tends to be further improved.

The content of the imidazole compound or the organophosphorus compound may be approximately 0.1 to 10 parts by mass based on 100 parts by mass of the resin solid content, and from the viewpoint of achieving action effects of the present invention more effectively and reliably, it is preferably 0.2 to 5.0 parts by mass, and more preferably 0.3 to 1.0 parts by mass.

Examples of the additional curing accelerator (F) other than the imidazole compound and the organophosphorus compound include, but are not particularly limited to, for example, organic peroxides (for example, benzoyl peroxide, lauroyl peroxide, acetyl peroxide, parachlorobenzoyl peroxide, di-tert-butyl-di-perphthalate, and the like); azo compounds (for example, azobisnitrile and the like); tertiary amines (for example, N,N-dimethylbenzylamine, N,N-dimethylaniline, N,N-dimethyltoluidine, N,N-dimethylpyridine, 2-N-ethylanilinoethanol, tri-n-butylamine, pyridine, quinoline, N-methylmorpholine, triethanolamine, triethylenediamine, tetramethylbutanediamine, N-methylpiperidine, and the like); organometallic salts (for example, lead naphthenate, lead stearate, zinc naphthenate, zinc octylate, tin oleate, dibutyltin maleate, manganese naphthenate, cobalt naphthenate, acetylacetone iron, and the like); products obtained by dissolving these organometallic salts in hydroxy group containing compounds such as phenols and bisphenols; inorganic metal salts (for example, tin chloride, zinc chloride, aluminum chloride, and the like); and organotin compounds (for example, dioctyltin oxide, other alkyltins, alkyltin oxides, and the like). These curing accelerators are used alone, or used in combination of two or more kinds.

The total content of the curing accelerator (F) is preferably 5.0 parts by mass or less based on 100 parts by mass of the resin solid content, more preferably 3.0 parts by mass or less, and still more preferably 0.3 to 1.0 parts by mass, from the viewpoint of achieving action effects of the present invention more effectively and reliably.

[Solvent]

The resin composition of the present embodiment may contain a solvent. When the resin composition of the present embodiment contains a solvent, the viscosity at the time of preparation of the resin composition is lowered, which tends to make it further excellent in the handleability (handling properties) and in the impregnation properties to the base material.

The solvent is not particularly limited as long as it is capable of dissolving a part or all of each component in the resin composition, but examples thereof include, for example, ketones (acetone, methyl ethyl ketone, methyl cellosolve, and the like), aromatic hydrocarbons (for example, toluene, xylene, and the like), amides (for example, dimethyl formaldehyde and the like), propylene glycol monomethyl ether and its acetate, and the like. These solvents are used alone, or used in combination of two or more kinds.

The method for producing the resin composition of the present embodiment is not particularly limited, and examples thereof include, for example, a method in which each component is compounded in a solvent in a batch or sequentially, and stirred. Upon this, in order to dissolve or disperse each component uniformly, publicly known treatments such as stirring, mixing, and kneading treatments are used.

[Prepreg]

A prepreg of the present embodiment comprises a base material; and the resin composition of the present embodiment with which the base material is impregnated or coated. The prepreg may be a prepreg obtained by publicly known methods, as mentioned above, and specifically, it is obtained by impregnating or coating a base material with the resin composition of the present embodiment and then semi-curing (B-staging) it by heating and drying under conditions of 100 to 200° C.

The prepreg of the present embodiment also encompasses the form of a cured product obtained by thermally curing the prepreg in a semi-cured state under conditions with a heating temperature of 200 to 230° C. and a heating time of 60 to 180 minutes.

The content of the resin composition in the prepreg is preferably 30 to 90% by volume, more preferably 35 to 85% by volume, and still more preferably 40 to 80% by volume based on the total amount of the prepreg, in terms of the solid content of the prepreg. When the content of the resin composition is within the range described above, the moldability tends to be further improved. Note that the solid content of the prepreg refers to the components obtained by removing the solvent from the prepreg, and for example, the filler material is included in the solid content of the prepreg.

(Base Material)

The base material is not particularly limited, and examples thereof include, for example, publicly known base materials that are used as materials for a variety of printed wiring boards. Specific examples of the base material include glass base materials, inorganic base materials other than glass (for example, inorganic base materials composed of inorganic fibers other than glass such as quartz), organic base materials (for example, organic base materials composed of organic fibers such as fully aromatic polyamides, polyesters, poly-para-phenylenebenzoxazole, and polyimides). These base materials are used alone, or used in combination of two or more kinds. Among the above, the glass base material is preferable from the viewpoint of further improving the stiffness and of being further excellent in the heating dimensional stability.

(Glass Base Material)

Examples of the fibers composing the glass base material include, for example, E glass, D glass, S glass, T glass, Q glass, L glass, NE glass, HME glass, and the like. Among the above, it is preferable that the fibers composing the glass base material should be one or more fibers selected from the group consisting of E glass, D glass, S glass, T glass, Q glass, L glass, NE glass, and HME glass from the viewpoint of being further excellent in the strength and low water absorption.

Examples of the form of the base material include, but are not particularly limited to, for example, forms such as woven fabrics, nonwoven fabrics, rovings, chopped strand mats, and surfacing mats. The method for weaving woven fabrics is not particularly limited. However, for example, plain weave, basket weave, twill weave, and the like are known, and the method can be selected from these publicly known weaving methods as appropriate depending on an intended application and performance. In addition, glass woven fabrics obtained by subjecting the above to a fiber opening treatment or a surface treatment with a silane coupling agent or the like are suitably used. Although the thickness and the mass of the base material are not particularly limited, usually, those with a thickness of approximately 0.01 to 0.3 mm are suitably used.

[Laminate]

A laminate of the present embodiment has the prepreg of the present embodiment. The laminate of the present embodiment comprises one or a plurality of prepregs, and when it comprises a plurality of prepregs, it has a form in which prepregs are laminated. The laminate of the present embodiment has excellent heat resistance, chemical resistance, low water absorption, and electrical properties by having the prepreg of the present embodiment.

[Metal Foil-Clad Laminate]

A metal foil-clad laminate of the present embodiment has the prepreg of the present embodiment; and metal foil disposed on one surface or both surfaces of the prepreg. The metal foil-clad laminate of the present embodiment comprises one or a plurality of prepregs. When the number of the prepreg is one, the metal foil-clad laminate has a form in which metal foil is disposed on one surface or both surfaces of the prepreg. When the number of the prepreg is plural, the metal foil-clad laminate has a form in which the metal foil is disposed on one surface or both surfaces of the laminated prepregs (the laminate of prepregs). The metal foil-clad laminate of the present embodiment has excellent heat resistance, chemical resistance, low water absorption, and electrical properties by having the prepreg of the present embodiment.

The metal foil (conductor layer) is not particularly limited as long as it is metal foil used as a material for a variety of printed wiring boards, and examples thereof include, for example, metal foil of copper, aluminum, and the like, and examples of metal foil of copper include copper foil such as rolled copper foil and electrolytic copper foil. The thickness of the conductor layer is, for example, 1 to 70 μm, and is preferably 1.5 to 35 μm.

The method for forming the laminate and the metal foil-clad laminate, and the forming conditions therefor are not particularly limited, and the approaches and conditions for general laminates and multilayer boards for printed wiring boards can be applied. For example, upon forming the laminate or the metal foil-clad laminate, a multistage press, a multistage vacuum press, a continuous forming machine, an autoclave forming machine, or the like can be used. In addition, the forming (laminate forming) of the laminate or the metal foil-clad laminate is generally carried out under conditions with a temperature of 100 to 300° C., a surface pressure of 2 to 100 kgf/cm$^2$, and a heating time in the range of 0.05 to 5 hours. Furthermore, as required, subsequent curing may also be carried out at a temperature of 150 to 300° C. In particular, when a multistage press is used, a temperature of 200° C. to 250° C., a pressure of 10 to 40 kgf/cm$^2$, and a heating time of 80 to 130 minutes are preferable from the viewpoint of sufficiently accelerating the curing of the prepreg, and a temperature of 215° C. to 235° C., a pressure of 25 to 35 kgf/cm$^2$, and a heating time of 90 to 120 minutes are more preferable. In addition, a multilayer board can also be fabricated by laminate forming the prepreg mentioned above and a separately fabricated wiring board for an inner layer in combination.

[Printed Wiring Board]

A printed wiring board of the present embodiment has an insulating layer formed of the prepreg of the present embodiment; and a conductor layer formed on the surface of the insulating layer. The printed wiring board of the present embodiment can be formed by, for example, etching the metal foil of the metal foil-clad laminate of the present embodiment into a predetermined wiring pattern to form a conductor layer. The printed wiring board of the present embodiment has excellent heat resistance, chemical resistance, low water absorption, and electrical properties by having the prepreg of the present embodiment.

Specifically, the printed wiring board of the present embodiment can be produced by, for example, the following method. First, the metal foil-clad laminate of the present embodiment is provided. The metal foil of the metal foil-clad laminate is etched into a predetermined wiring pattern to form an inner layer board having a conductor layer (inner layer circuits). Next, on the surface of the conductor layer (inner layer circuit) of the inner layer board, a predetermined number of prepregs and metal foil for outer layer circuits are laminated in this order, and heat and pressure are applied for integral forming (laminate forming), thereby obtaining a laminate. Note that the method for laminate forming and the forming conditions therefor are the same as the above-described method for laminate forming the laminate and the metal foil-clad laminate and the forming conditions therefor. Then, this laminate is subjected to perforation for through holes and via holes, and then, on the wall surfaces of the thus formed holes, plating metal films that allow conduction between the conductor layer (inner layer circuits) and the metal foil for outer layer circuits are formed. Next, the metal foil for outer layer circuits is etched into a predetermined wiring pattern to form an outer layer board having a conductor layer (outer layer circuits). As described above, the printed wiring board is produced.

Alternatively, when the metal foil-clad laminate is not used, a printed wiring board may be fabricated by forming a conductor layer, which will serve as circuits, on the prepreg described above. In this case, an approach of nonelectrolytic plating may be used to form the conductor layer.

[Multilayer Printed Wiring Board (Multilayer Coreless Substrate)]

A multilayer printed wiring board of the present embodiment has a plurality of insulating layers comprising a first insulating layer and one or a plurality of second insulating layers laminated on one surface side of the first insulating layer; and a plurality of conductor layers comprising a first conductor layer disposed between each of the plurality of insulating layers and a second conductor layer disposed on the surface of the outermost layer of the plurality of insulating layers, and the first insulating layer and the second insulating layer each have the prepreg of the present embodiment. A specific example of the multilayer printed wiring board of the present embodiment is shown in FIG. 1. The multilayer printed wiring board shown in FIG. 1 comprises a first insulating layer (1) and two second insulating layers (2) laminated in the direction of one surface of the first insulating layer (1) (in the direction of the lower surface as shown in the FIGURE), wherein the first insulating layer (1) and the two second insulating layers (2) are each formed of one prepreg of the present embodiment. Also, the multilayer printed wiring board shown in FIG. 1 has a plurality of conductor layers comprising first conductor layers (3) disposed between each of the plurality of insulating layers (1 and 2) and second conductor layers (3) disposed on the outermost layers of those plurality of insulating layers (1 and 2).

The multilayer printed wiring board of the present embodiment is a so-called coreless type multilayer printed wiring board (multilayer coreless substrate) in which a second insulating layer is laminated only in the direction of one surface of the first insulating layer, for example. For the method for producing the multilayer printed wiring board of the present embodiment, for example, publicly known methods can be referred to.

Hereinafter, the present invention will be further described with reference to Examples and Comparative Examples, but the present invention is not limited to these Examples in any way.

Example 1

After mixing 36.8 parts by mass of a naphthol aralkyl-based phenol ("SN-495-V" from NIPPON STEEL & SUMIKIN CHEMICAL CO., LTD.) as a phenolic compound (A), 24.6 parts by mass of a novolac-based maleimide ("BMI-2300" from Daiwa Kasei Industry Co., Ltd.) as a maleimide compound (B), 38.6 parts by mass of a naphthylene ether-based epoxy compound ("HP-6000" from DIC Corporation) as an epoxy compound (C), 5.0 parts by mass of a silane coupling agent (G) ("KBM-403" from Shin-Etsu Chemical Co., Ltd.), 1.0 parts by mass of a wetting and dispersing agent (H) ("DISPERBYK-161" from BYK Japan KK.), 100 parts by mass of a spherical silica e1 (a product from Admatechs Company Limited, "SC2050-MB") and 100 parts by mass of a spherical silica e2 ("SC5050-MOB" from Admatechs Company Limited) as an inorganic filler (E), 25 parts by mass of a silicone composite powder ("KMP605M" from Shin-Etsu Chemical Co., Ltd.) as an organic filler (I), 5.0 parts by mass of a cyclic carbodiimide compound (D) ("TCC" from TEIJIN LIMITED.), and 0.5 parts by mass of an imidazole compound ("TPIZ": 2,4,5-triphenylimidazole from Tokyo Chemical Industry Co., Ltd.) as a curing accelerator (F), the mixture was diluted with methyl ethyl ketone, thereby obtaining a varnish (resin composition). An E glass woven fabric (IPC #1280) was impregnated and coated with this varnish (resin composition), and was heated and dried at 140° C. for 3 minutes to obtain a prepreg with a thickness of about 80 μm. The content of the resin composition (solid content (including filler)) in the resulting prepreg was 73% by volume.

Example 2

A varnish (resin composition) was obtained in the same manner as in Example 1 except that the amount of the cyclic carbodiimide compound (D) to be compounded was changed from 5.0 parts by mass to 10 parts by mass. An E glass woven fabric (IPC #1280) was impregnated and coated with this varnish (resin composition), and was heated and dried at 140° C. for 3 minutes, thereby obtaining a prepreg with a thickness of about 80 μm. The content of the resin composition (solid content (including filler)) in the obtained prepreg was 73% by volume.

Example 3

A varnish (resin composition) was obtained in the same manner as in Example 1 except that the amount of the cyclic carbodiimide compound (D) to be compounded was changed from 5.0 parts by mass to 15 parts by mass. An E glass woven fabric (IPC #1280) was impregnated and coated with this varnish (resin composition) and was heated and dried at 140° C. for 3 minutes to obtain a prepreg with a thickness of about 80 μm. The content of the resin composition (solid content (including filler)) in the resulting prepreg was 73% by volume.

Example 4

An E glass woven fabric (IPC #2116) was impregnated and coated with a varnish (resin composition) prepared in the same manner as in Example 2, and was heated and dried at 140° C. for 3 minutes to obtain a prepreg with a thickness of about 100 μm. The content of the resin composition (solid content (including filler)) in the resulting prepreg was 58% by volume.

Example 5

A varnish (resin composition) was obtained in the same manner as in Example 2 except that 0.5 parts by mass of an organophosphorus compound ("TPTP": tri-p-tolylphosphine from HOKKO CHEMICAL INDUSTRY CO., LTD.) was used instead of the imidazole compound ("TPIZ": 2,4,5-triphenylimidazole from Tokyo Chemical Industry Co., Ltd.). An E glass woven fabric (IPC #2116) was impregnated and coated with this varnish (resin composition) and was heated and dried at 140° C. for 3 minutes to obtain a prepreg with a thickness of about 100 μm. The content of the resin composition (solid content (including filler)) in the obtained prepreg was 58% by volume.

Comparative Example 1

A varnish (resin composition) was obtained in the same manner as in Example 1 except that the amount of the spherical silica e1 to be compounded was changed from 100 parts by mass to 150 parts by mass, the amount of the spherical silica e2 to be compounded was changed from 100 parts by mass to 150 parts by mass, and the amount of the cyclic carbodiimide compound (D) to be compounded was changed from 5.0 parts by mass to 0 parts by mass. An E glass woven fabric (IPC #1280) was impregnated and coated with this varnish (resin composition) and was heated and dried at 140° C. for 3 minutes, thereby obtaining a prepreg with a thickness of about 80 μm. The content of the resin composition (solid content (including filler)) in the obtained prepreg was 73% by volume.

Comparative Example 2

A varnish (resin composition) was obtained in the same manner as in Example 1 except that the amount of the cyclic carbodiimide compound (D) to be compounded was changed from 5.0 parts by mass to 0 parts by mass. An E glass woven fabric (IPC #1280) was impregnated and coated with this varnish (resin composition), and was heated and dried at 140° C. for 3 minutes to obtain a prepreg having a thickness of about 80 μm. In the obtained prepreg, the content of the resin composition (solid content (including filler)) was 73% by volume.

Comparative Example 3

A varnish (resin composition) was obtained in the same manner as in Comparative Example 1 except that 10 parts by mass of an acyclic carbodiimide compound ("V-05" from Nisshinbo Holdings Inc.) was added. An E glass woven fabric (IPC #1280) was impregnated and coated with this varnish (resin composition), and was heated and dried at 140° C. for 3 minutes, thereby obtaining a prepreg having a thickness of about 80 μm. In the resulting prepreg, the content of the resin composition (solid content (including filler)) was 73% by volume.

Comparative Example 4

An E glass woven fabric (IPC #2116) was impregnated and coated with a varnish (resin composition) prepared in the same manner as in Comparative Example 2, and was heated and dried at 140° C. for 3 minutes to obtain a prepreg with a thickness of about 100 μm. In the obtained prepreg, the content of the resin composition (solid content (including filler)) was 58% by volume.

Comparative Example 5

A varnish (resin composition) was obtained in the same manner as in Comparative Example 2 except that 0.5 parts by mass of an organophosphorus compound ("TPTP": tri-p-tolylphosphine from HOKKO CHEMICAL INDUSTRY CO., LTD.) was used instead of the imidazole compound ("TPIZ": 2,4,5-triphenylimidazole from Tokyo Chemical Industry Co., Ltd.). An E glass woven fabric (IPC #2116) was impregnated and coated with this varnish (resin composition), and was heated and dried at 140° C. for 3 minutes to obtain a prepreg with a thickness of about 100 μm. In the resulting prepreg, the content of the resin composition (solid content (including filler)) was 58% by volume.

Comparative Example 6

A varnish (resin composition) was obtained in the same manner as in Comparative Example 1 except that the amount of the cyclic carbodiimide compound (D) to be compounded was changed from 0 parts by mass to 5.0 parts by mass. An E glass woven fabric (IPC #1280) was impregnated and coated with this varnish (resin composition) and was heated and dried at 140° C. for 3 minutes, thereby obtaining a prepreg having a thickness of about 80 μm. The content of the resin composition (solid content (including filler)) in the resulting prepreg was 73% by volume.

[Measurement and Evaluation of Physical Properties]

Using the varnishes or prepregs obtained in Examples 1 to 3 and Comparative Examples 1 to 3, samples for the measurement and evaluation of physical properties were prepared according to the procedure shown for each of the following items, and the flow properties, the solder heat resistance, the glass transition temperature (Tg), the resistance to desmear treatments, the water absorption rate, the electrical properties, and the flame retardance were measured and evaluated. The results of Examples and Comparative Examples are shown in Table 1.

[Flow Properties]

The obtained prepreg was rubbed and loosened, and powder of the resin composition in the prepreg was taken. That powder was placed in a predetermined metal mold and molded under direct pressure to form a resin rod. Next, the resin rod was placed in the heating section of a Koka-type flow tester (Shimadzu Corporation, "CFT-500D"), and the melt viscosity (unit: Pa·s) was measured at 120±0.2° C.
○: 100 Pa·s or more and less than 1500 Pa·s
Δ: 1500 Pa·s or more and less than 3000 Pa·s
X: 3000 Pa·s or more

[Solder Heat Resistance]

A metal foil-clad laminate obtained by the method described in the [Electrical properties] section below was cut into samples with a size of 50 mm×50 mm. The resulting samples were floated in 300° C. solder for 30 minutes and visually evaluated for the presence or absence of appearance delamination. The evaluation criteria are as follows (n=3). Note that, as for Comparative Examples 1 and 6, laminates could not be produced due to the occurrence of voids during the forming. For this reason, the solder heat resistance was not evaluated for Comparative Examples 1 and 6.
○: No delamination on all three samples.
X: Delamination on all three samples.

[Glass Transition Temperature]

Copper foil ("3EC-VLP" manufactured by MITSUI MINING & SMELTING CO., LTD., thickness of 12 μm) was disposed on both top and bottom surfaces of one obtained prepreg, which was then subjected to laminate forming (thermosetting) at a pressure of 30 kgf/cm$^2$ and a temperature of 220° C. for 100 minutes, thereby obtaining a copper foil-clad laminate having an insulating layer formed of the prepreg and the copper foil. The thickness of the insulating layer of this copper foil-clad laminate was approximately 80 to 100 μm. The copper foil on the surfaces of the obtained copper foil-clad laminate was removed by etching. Then, the copper foil-clad laminate was cut into a size of 5.0 mm×20 mm with a dicing saw, thereby obtaining measurement samples. Using this measurement sample, the glass transition temperature (Tg) was measured by a DMA method using a dynamic viscoelasticity analysis apparatus (manufactured by TA Instruments) in accordance with JIS C6481 (average value of n=3). Note that, as for Comparative Examples 1 and 6, laminates could not be produced because of the occurrence of voids during the forming. For this reason, the glass transition temperature was not evaluated for Comparative Examples 1 and 6.

[Chemical Resistance (Desmear Resistance)]

After removing, by etching, the copper foil of a metal foil-clad laminate obtained by the method described in the [Glass transition temperature] section, the following immersion treatment was carried out. At first, the laminate, from which the copper foil had been removed, was immersed in a swelling solution (a product from Atotech Japan K.K., Swelling Dip Securiganth P) at 80° C. for 10 minutes. Next, the immersed laminate was immersed in a roughening solution (a product from Atotech Japan K.K., Concentrate Compact CP) at 80° C. for 5 minutes. Then, the immersed laminate was immersed in a neutralizing solution (a product from Atotech Japan K.K., Reduction Conditioner Securiganth P500) at 45° C. for 10 minutes. After repeating this immersion treatment three times, the amount of mass reduction (% by mass) was measured. Note that, as for Comparative Examples 1 and 6, laminates could not be produced because voids occurred during the forming. For this reason, the desmear resistance was not evaluated for Comparative Examples 1 and 6.

[Low Water Absorption]

The copper foil on both surfaces of a metal foil-clad laminate obtained by the method described in the [Glass transition temperature] section was removed by etching. Thereafter, the laminate was cut into samples of 30 mm×30 mm, which were treated with a pressure cooker tester (a product from HIRAYAMA Manufacturing Corporation, PC-3 model) in accordance with JIS C648 under conditions of 121° C. and 2 atmospheres for 24 hours. Then, the water absorption rate was measured. The water absorption rate was determined by the change in the weight of the samples before and after the treatment. Note that, as for Comparative Examples 1 and 6, laminates could not be produced because voids were generated during the forming. For this reason, the low water absorption was not evaluated for Comparative Examples 1 and 6.

[Electrical Properties]

Copper foil ("3EC-VLP" manufactured by MITSUI MINING & SMELTING CO., LTD., thickness of 12 m) was disposed on both top and bottom surfaces of five obtained prepregs, which was then subjected to laminate forming (thermosetting) at a pressure of 30 kgf/cm² and a temperature of 220° C. for 100 minutes, thereby obtaining copper foil-clad laminates having an insulating layer formed of the prepreg and the copper foil. The thickness of the insulating layer of this copper foil-clad laminate was approximately 400 to 450 μm. The copper foil on the surfaces of the obtained copper foil-clad laminates was removed by etching. Then, the copper foil-clad laminates were cut into a size of 100 mm×1 mm×0.4 mmt with a dicing saw, thereby obtaining measurement samples. Using these measurement samples, the dielectric constant (Dk) at 1 GHz and 10 GHz and the dielectric loss tangent (Df) at 1 GHz and 10 GHz were measured with a perturbation method cavity resonator (a product from Agilent Technologies, Agilent 8722ES). Note that, as for Comparative Examples 1 and 6, laminates could not be produced since voids were generated during the forming. For this reason, the electrical properties were not evaluated for Comparative Examples 1 and 6.

[Flame Retardance]

Using the measurement samples obtained in the [Electrical properties] section, a flame retardance test was performed in accordance with the method of UL94 vertical burning test. Note that, as for Comparative Examples 1 and 6, laminates could not be produced since voids occurred during the forming. For this reason, the flame retardance was not evaluated for Comparative Examples 1 and 6.

TABLE 1

| | | Example 1 | Example 2 | Example 3 | Example 4 | Example 5 | Comparative Example 1 | Comparative Example 2 | Comparative Example 3 | Comparative Example 4 | Comparative Example 5 | Comparative Example 6 |
|---|---|---|---|---|---|---|---|---|---|---|---|---|
| Flow properties | | ○ | ○ | ○ | ○ | ○ | X | ○ | ○ | ○ | ○ | X |
| Solder heat resistance | | ○ | ○ | ○ | ○ | ○ | — | ○ | X | ○ | ○ | — |
| Glass transition temperature (Tg) | | 275.13 | 277.71 | 281 | 278 | 240 | Unmeasurable | 270 | 270 | 270 | 235 | Unmeasurable |
| Desmear resistance | | −1.4 | −1.5 | −1.3 | −1.0 | −0.6 | Unmeasurable | −2.2 | −2.0 | −1.7 | −1.2 | Unmeasurable |
| Water absorption rate | | 0.63 | 0.63 | 0.62 | 0.40 | 0.40 | Unmeasurable | 0.64 | 0.73 | 0.41 | 0.41 | Unmeasurable |
| Electrical properties | Dk(1 GHz) | 4.1 | 4.1 | 4.1 | 4.3 | 4.3 | Unmeasurable | 4.1 | 4.1 | 4.3 | 4.3 | Unmeasurable |
| | Df(1 GHz) | 0.0082 | 0.0077 | 0.0072 | 0.0071 | 0.0072 | Unmeasurable | 0.0084 | 0.0073 | 0.0075 | 0.0076 | Unmeasurable |
| | Dk(10 GHz) | 3.8 | 3.8 | 3.8 | 4.0 | 4.0 | Unmeasurable | 3.8 | 3.7 | 4.1 | 4.0 | Unmeasurable |
| | Df(10 GHz) | 0.0102 | 0.0099 | 0.0096 | 0.0097 | 0.0095 | Unmeasurable | 0.0106 | 0.0096 | 0.0102 | 0.0102 | Unmeasurable |
| Flame retardance | UL-94 | V-0 | V-0 | V-1 | V-0 | V-0 | Unmeasurable | V-0 | V-1 | V-0 | V-0 | Unmeasurable |

From the results of Examples 1 to 3 and Comparative Example 2, the following was found. Firstly, it was found that the flow properties are not deteriorated even when the cyclic carbodiimide compound (D) was compounded into the varnish as shown in Examples 1 to 3. Also, it was found that Examples 1 to 3, in which the cyclic carbodiimide compound (D) was compounded into the varnish, can improve properties of the glass transition temperature, chemical resistance, and electrical properties (low dielectric loss tangent properties) as compared to Comparative Example 2, in which the cyclic carbodiimide compound (D) was not compounded into the varnish. In addition, it was found that these properties tend to be improved as the amount of the cyclic carbodiimide compound (D) to be compounded is increased. Moreover, when compared to Comparative Example 3, in which the acyclic carbodiimide compound (chain carbodiimide compound) was used, the flow properties and electrical properties were approximately at the same level as those of Examples, but the heat resistance and desmear resistance were not improved and the water absorption was poor. From this, it can be assumed that, although the acyclic carbodiimide compound reacts with a variety of thermosetting resins, it does not form crosslinks due to its structure, and therefore, although the electrical properties are improved, the heat resistance and desmear resistance are not improved. Also, the deterioration of heat resistance and water absorption rate is presumed to be due to the reaction terminal compound of the acyclic carbodiimide compound, but the present invention is not limited by this presumption in any way.

The present application is based on Japanese Patent Application No. 2018-150563 filed in the Japan Patent Office on Aug. 9, 2018, the contents of which are incorporated herein by reference.

INDUSTRIAL APPLICABILITY

The present invention has industrial applicability as a resin composition for a printed wiring board.

The invention claimed is:

1. A resin composition for a printed wiring board, comprising:
   a phenolic compound (A); a maleimide compound (B); an epoxy compound (C); a cyclic carbodiimide compound (D); an inorganic filler (E); and a curing accelerator (F),
   wherein a content of the inorganic filler (E) is 100 to 250 parts by mass based on 100 parts by mass of a resin solid content.

2. The resin composition for the printed wiring board according to claim 1,
   wherein a content of the cyclic carbodiimide compound (D) is 2.0 to 15 parts by mass based on 100 parts by mass of the resin solid content.

3. The resin composition for the printed wiring board according to claim 1,
   wherein a content of the cyclic carbodiimide compound (D) is 2.5 to 12.0 parts by mass based on 100 parts by mass of the resin solid content.

4. The resin composition for the printed wiring board according to claim 1,
   wherein a content of the maleimide compound (B) is 10 to 30 parts by mass based on 100 parts by mass of the resin solid content.

5. The resin composition for the printed wiring board according to claim 1,
   wherein the cyclic carbodiimide compound (D) has a cyclic structure represented by the following formula (1), and
   the number of atoms forming the cyclic structure is 8 to 50:

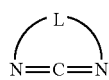

(1)

wherein L is a divalent to tetravalent bonding group, which is an aliphatic group, an alicyclic group, an aromatic group, or a group formed by combining them, and the bonding group optionally contains a heteroatom and/or a substituent.

6. The resin composition for the printed wiring board according to claim 1,
   wherein the cyclic carbodiimide compound (D) comprises a polyvalent cyclic carbodiimide compound containing 2 or more carbodiimide groups in one molecule.

7. The resin composition for the printed wiring board according to claim 6,
   wherein the polyvalent cyclic carbodiimide compound is a compound represented by the following formula (2):

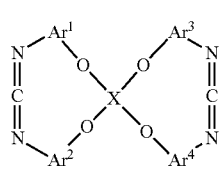

(2)

wherein X is a tetravalent group represented by the following formula (3), $Ar^1$ to $Ar^4$ are each independently a divalent linking group, which is a phenylene group or a naphthalene-diyl group, and the linking group optionally has a substituent

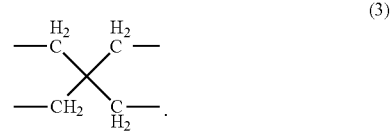

(3)

8. The resin composition for the printed wiring board according to claim 7,
   wherein the compound represented by formula (2) is a compound represented by the following formula (4):

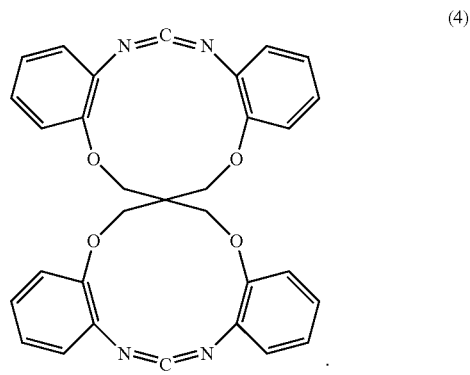 [SMILES: C1=Nc2ccccc2OCC2(COc3ccccc3N=1)COc1ccccc1N=C=Nc1ccccc1OC2]

(4)

9. The resin composition for the printed wiring board according to claim 1,
   wherein the curing accelerator (F) comprises an imidazole compound and/or an organic phosphorus compound.

10. The resin composition for the printed wiring board according to claim 1,
    wherein the curing accelerator (F) comprises a compound represented by the following formula (5):

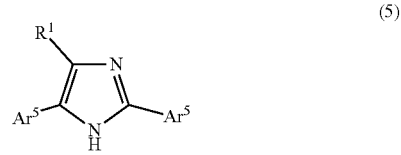

(5)

wherein each $Ar^5$ independently represents a phenyl group, a naphthalene group, a biphenyl group, or an anthracene group, all of which optionally have a substituent, $R^1$ represents a hydrogen atom, an alkyl group, or an aryl group, and when $R^1$ represents an alkyl group or an aryl group, it optionally has a substituent.

11. The resin composition for the printed wiring board according to claim 1,
    wherein the inorganic filler (E) comprises one or more selected from the group consisting of silica, boehmite, and alumina.

12. A prepreg comprising:
    a base material; and
    the resin composition for the printed wiring board according to claim 1 with which the base material is impregnated or coated.

13. A laminate comprising:
the prepreg according to claim 12.

14. A metal foil-clad laminate comprising:
the prepreg according to claim 12; and
metal foil disposed on one surface or both surfaces of the prepreg.

15. A printed wiring board comprising:
an insulating layer formed of the prepreg according to claim 12; and
a conductor layer formed on a surface of the insulating layer.

16. A multilayer printed wiring board comprising:
a plurality of insulating layers comprising a first insulating layer and one or a plurality of second insulating layers laminated on one surface side of the first insulating layer; and
a plurality of conductor layers comprising a first conductor layer disposed between each of the plurality of insulating layers and a second conductor layer disposed on a surface of an outermost layer of the plurality of insulating layers,
wherein the first insulating layer and the second insulating layer each have the prepreg according to claim 12.

* * * * *

UNITED STATES PATENT AND TRADEMARK OFFICE
CERTIFICATE OF CORRECTION

PATENT NO. : 11,702,504 B2
APPLICATION NO. : 17/264528
DATED : July 18, 2023
INVENTOR(S) : S. Yamaguchi et al.

It is certified that error appears in the above-identified patent and that said Letters Patent is hereby corrected as shown below:

In the Claims

Column 38, Line 2, please change "Ar'" to -- $Ar^1$ --.

Signed and Sealed this
Twenty-third Day of January, 2024

Katherine Kelly Vidal
*Director of the United States Patent and Trademark Office*